United States Patent [19]

Kobayashi et al.

[11] Patent Number: 5,465,071
[45] Date of Patent: Nov. 7, 1995

[54] INFORMATION SIGNAL PROCESSING APPARATUS

[75] Inventors: Takashi Kobayashi, Tokyo; Shinichi Hatae, Kanagawa, both of Japan

[73] Assignee: Canon Kabushiki Kaisha, Tokyo, Japan

[21] Appl. No.: 379,035

[22] Filed: Jan. 27, 1995

Related U.S. Application Data

[63] Continuation of Ser. No. 88,775, Jul. 8, 1993, abandoned.

[30] Foreign Application Priority Data

Jul. 13, 1992 [JP] Japan ................................. 4-185259
Jul. 13, 1992 [JP] Japan ................................. 4-185260
Jul. 13, 1992 [JP] Japan ................................. 4-185264

[51] Int. Cl.$^6$ ........................................... H03D 3/00
[52] U.S. Cl. ........................ 329/315; 329/341; 360/30; 360/38.1
[58] Field of Search ............................. 329/327, 315, 329/336, 341, 342, 343; 332/117; 360/30, 38.1; 455/42, 110, 337

[56] References Cited

U.S. PATENT DOCUMENTS

| | | | |
|---|---|---|---|
| 4,454,486 | 6/1984 | Hassun et al. | 332/117 |
| 4,656,432 | 4/1987 | Matzumura | 329/336 X |
| 4,835,622 | 5/1989 | Martens | 329/343 X |
| 4,910,469 | 3/1990 | Takahashi | 329/341 X |

*Primary Examiner*—David Mis
*Attorney, Agent, or Firm*—Robin, Blecker, Daley & Driscoll

[57] ABSTRACT

An information signal processing apparatus according to the present invention is arranged to receive as an input a frequency-modulated information signal having a predetermined frequency band, form a sample pulse signal by sampling the input frequency-modulated information signal in accordance with a clock signal having a first frequency which is selected so that a frequency which is 1/n times (n is a positive integer) a frequency of half the first frequency is positioned in a frequency band lower than the frequency band of the input frequency-modulated information signal and so that a frequency which is (n+1) times (n is a positive integer) the frequency of half the first frequency is positioned in a frequency band higher than the frequency band of the input frequency-modulated information signal, and demodulate the frequency-modulated information signal by performing computing processing of the formed sample pulse signal in accordance with the clock signal having the first frequency. According to the above-described arrangement, it is possible to reduce the amount of computation per unit time so that computing processing of the frequency-modulated information signal can be performed by a low-speed computational processing circuit. Accordingly, it is possible to reduce the complexity and cost of the apparatus.

19 Claims, 16 Drawing Sheets

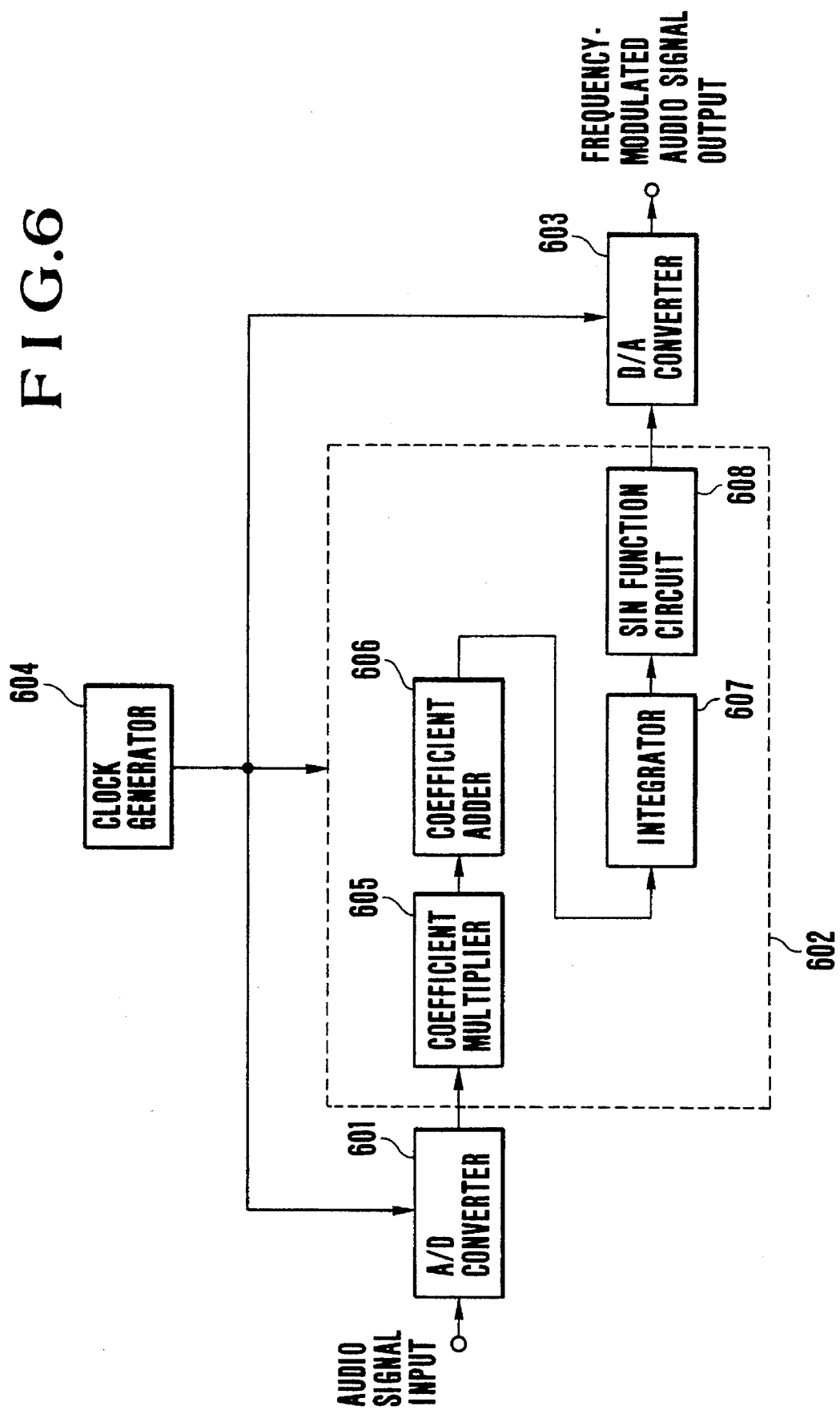

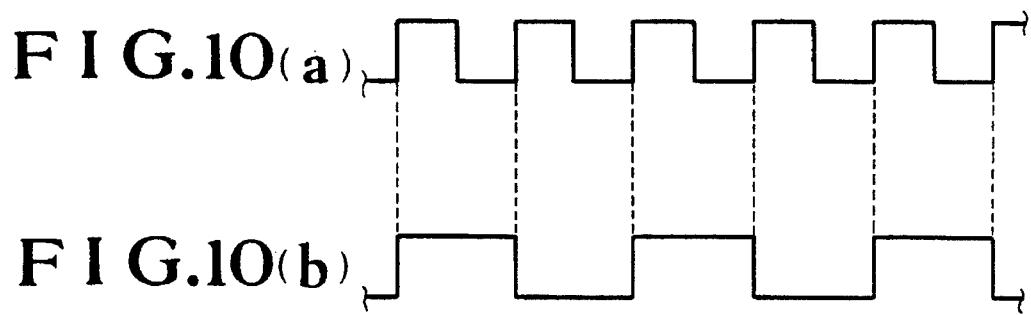
FIG.10(a)
FIG.10(b)
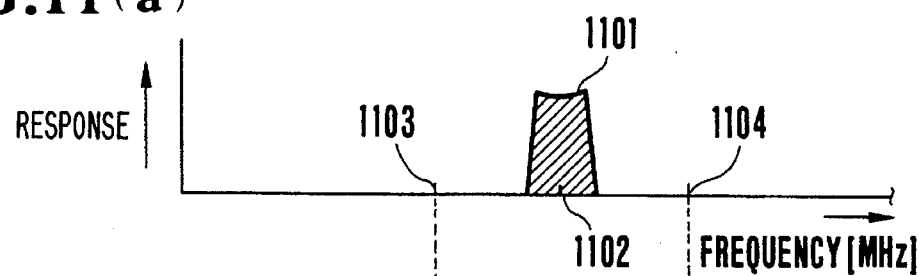
FIG.11(a)
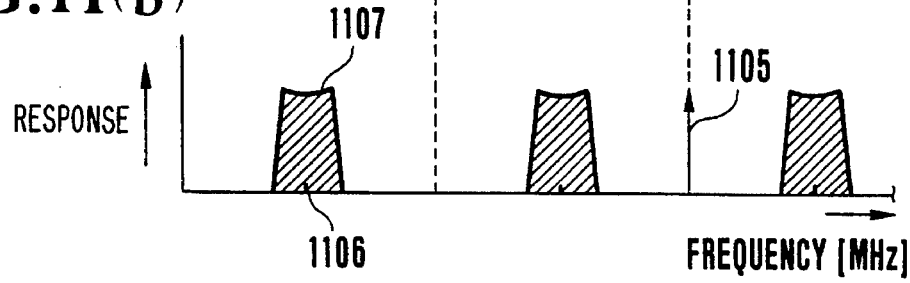
FIG.11(b)

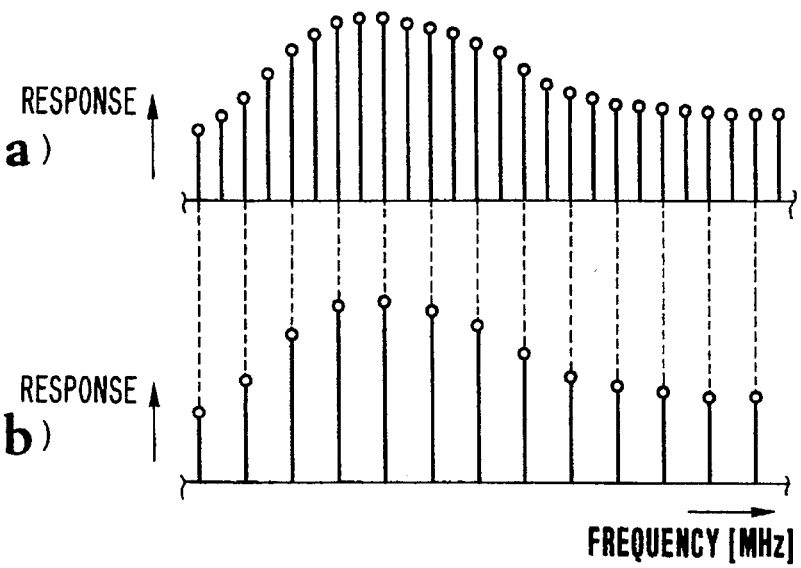
FIG.13(a)
FIG.13(b)
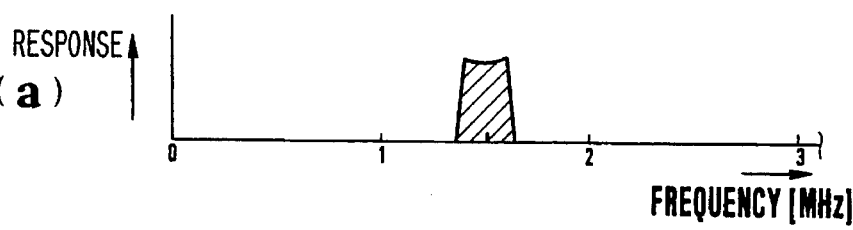
FIG.14(a)
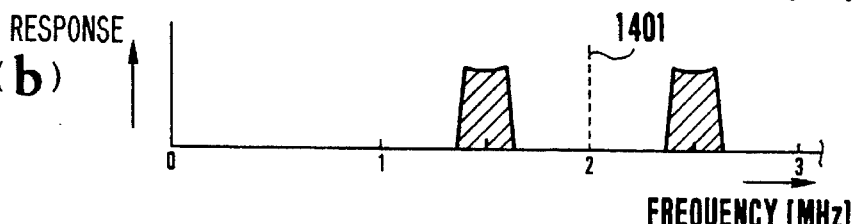
FIG.14(b)
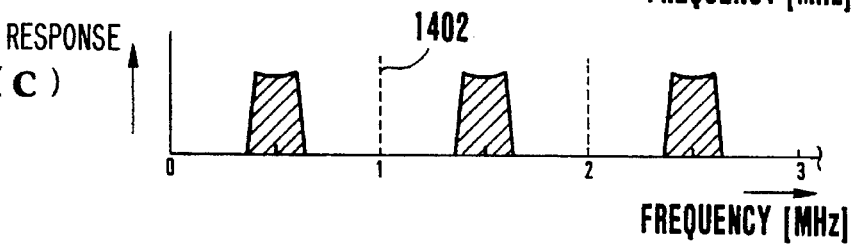
FIG.14(c)

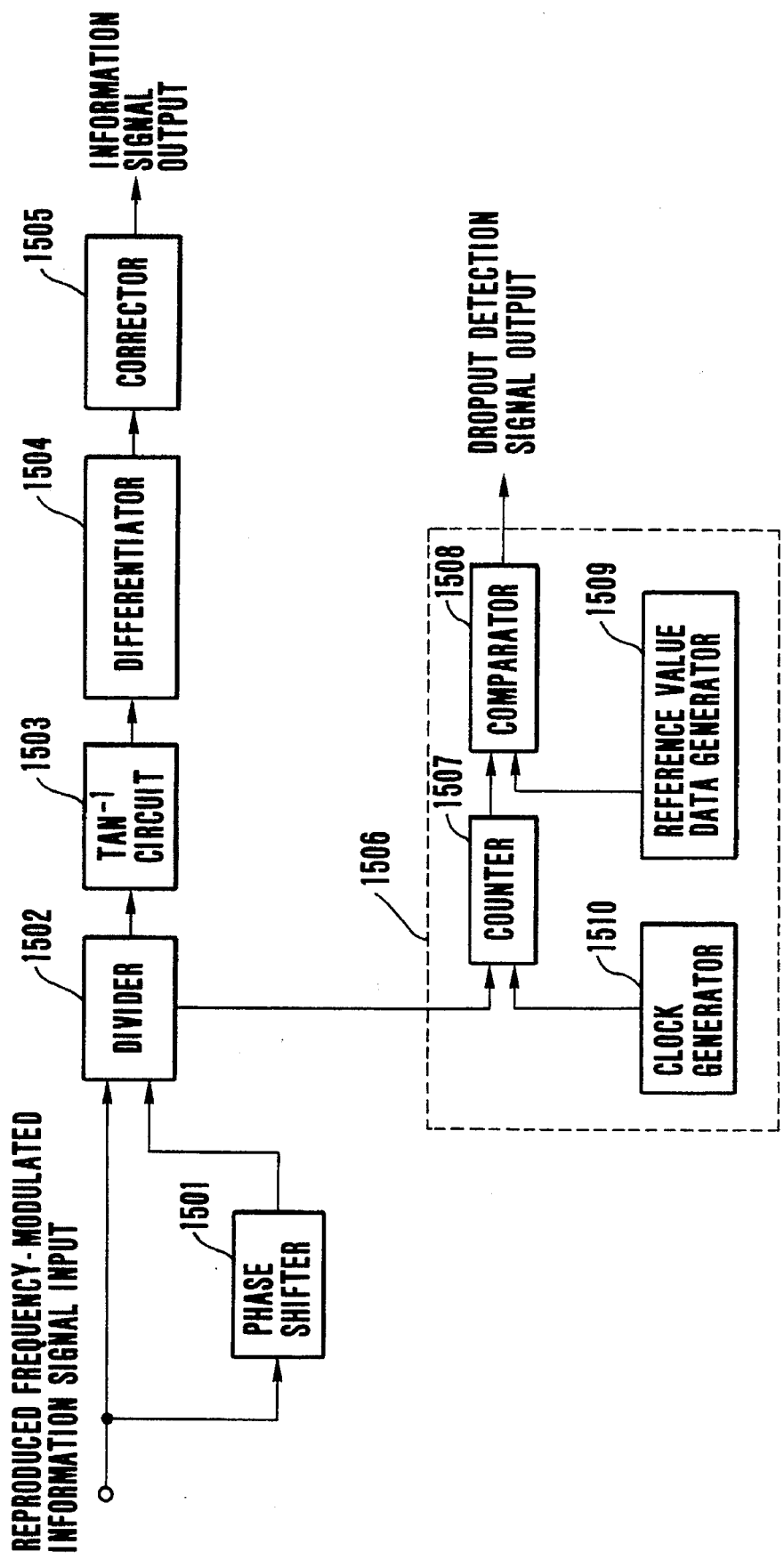
F I G. 15

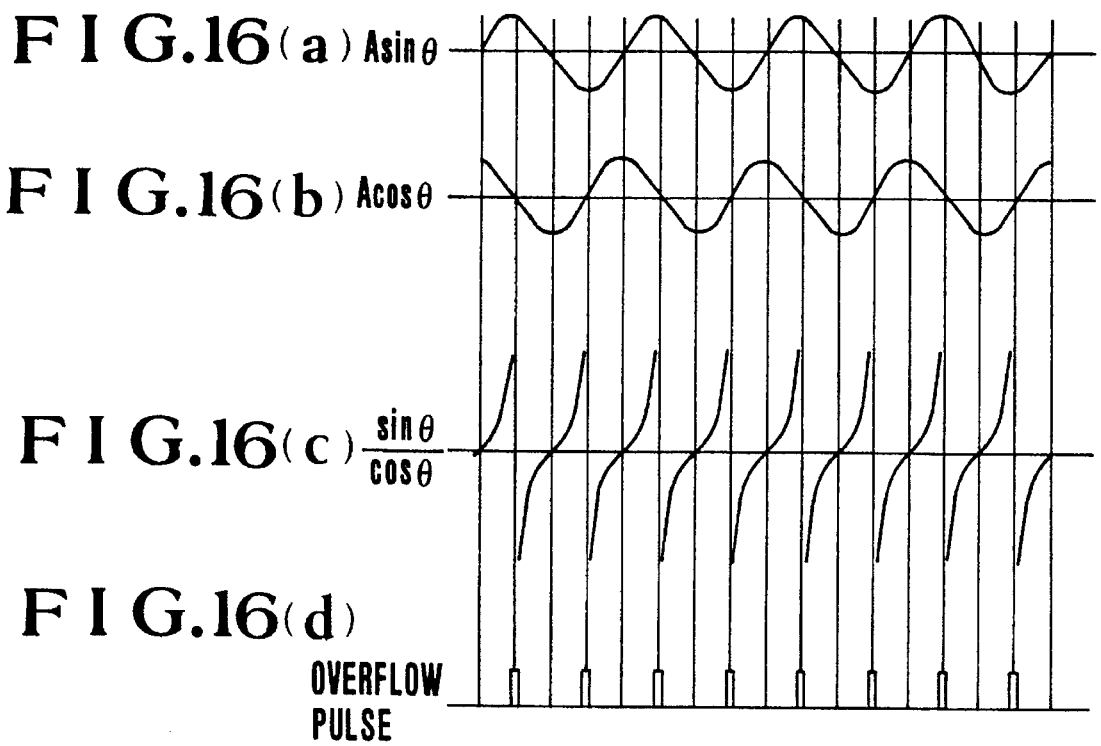
FIG.16(a) Asinθ
FIG.16(b) Acosθ
FIG.16(c) $\frac{\sin\theta}{\cos\theta}$
FIG.16(d) OVERFLOW PULSE
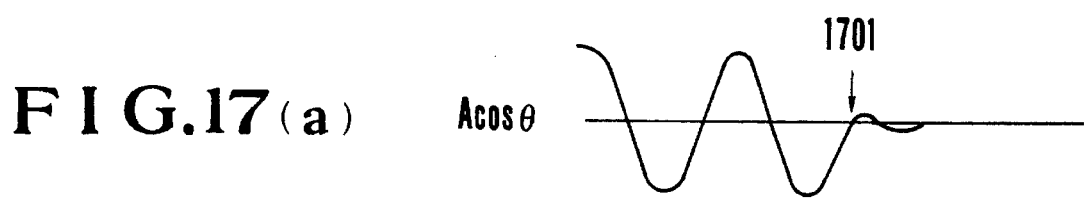
FIG.17(a) Acosθ
FIG.17(b) OVERFLOW PULSE
FIG.17(c) DROPOUT DETECTION SIGNAL

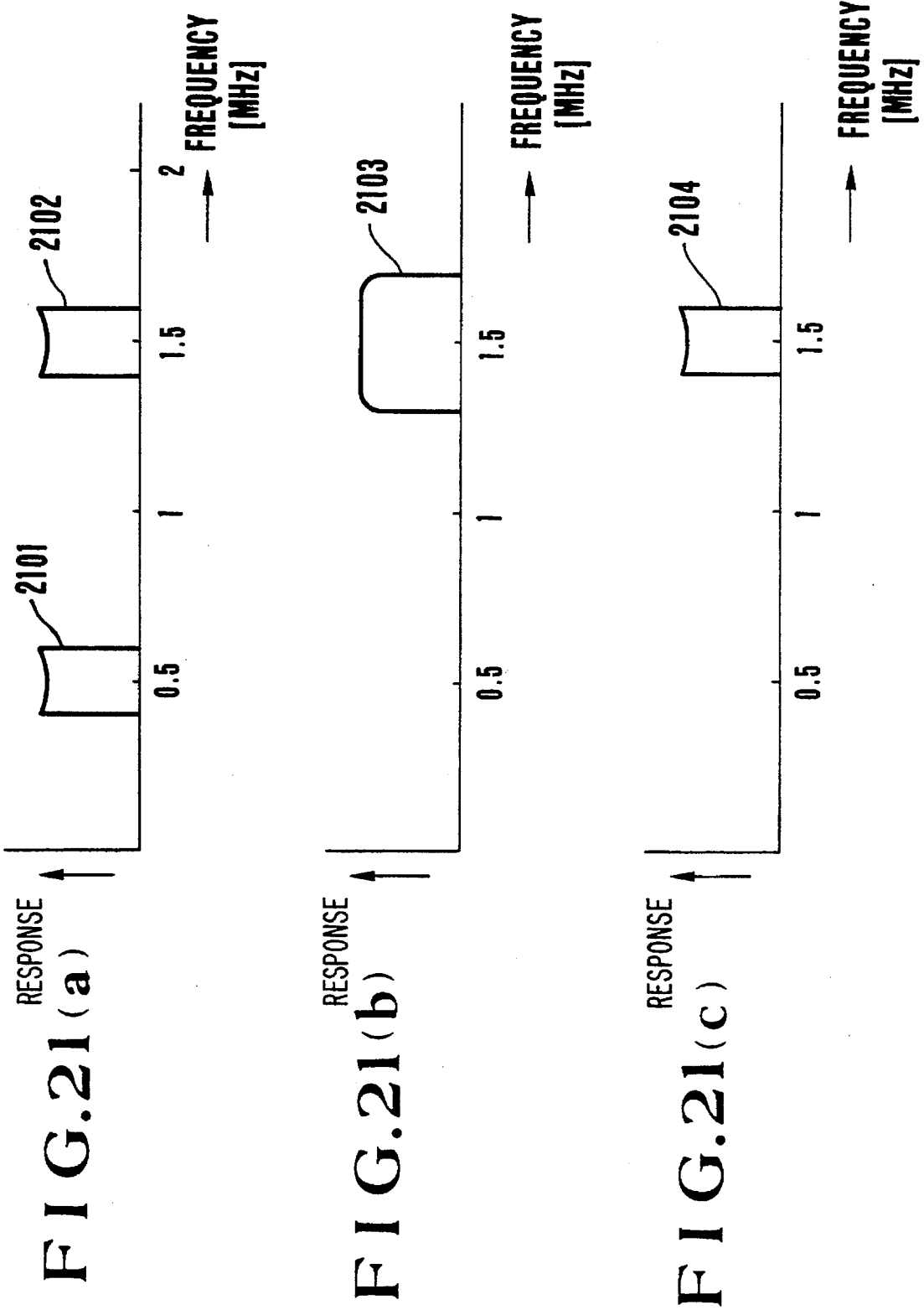

INFORMATION SIGNAL PROCESSING APPARATUS

This is a continuation application under 37 CFR 1.62 of prior application Ser. No. 08/088,775, filed Jul. 8, 1993, now abandoned.

BACKGROUND OF THE INVENTION

1. Field of the Invention

The present invention relates to an information signal processing apparatus for processing an information signal.

2. Description of the Related Art

As one example of an apparatus for processing a frequency-modulated information signal, there has heretofore been provided an apparatus, such as a video tape recorder, which is arranged to reproduce and demodulate an audio signal which is recorded on a magnetic tape in a frequency-modulated state.

FIG. 1 is a block diagram of a conventional information signal processing apparatus, and schematically shows one example of the arrangement of a demodulating apparatus for demodulating a frequency-modulated audio signal reproduced from a recording medium.

Referring to FIG. 1, a reproduced RF signal which has been reproduced from a recording medium (not shown), such as a magnetic tape, by a reproducing head is supplied to an analog/digital (A/D) converter 102 via a pre-filter 101.

The reproduced RF signal is a signal in which a four-frequency pilot signal 201 for tracking control, a modulated chrominance signal 202, a frequency-modulated audio signal 203 and a modulated luminance signal 204 are frequency-multiplexed as shown in FIG. 2(a) by way of example.

The pre-filter 101 of FIG. 1 has a characteristic which is selected to extract only a frequency band 205 in which the frequency-modulated audio signal 203 is positioned from the input reproduced RF signal as shown in FIG. 2(b) by way of example.

The A/D converter 102 performs sampling of the signal supplied from the pre-filter 101, in accordance with a clock signal of predetermined frequency generated by a clock generator 103, thereby forming and outputting a sample pulse signal.

The clock signal generated by the clock generator 103 is also supplied to each of the other parts in the demodulation processing block shown as a dashed-line frame in FIG. 1.

It is to be noted that the processing frequency of a demodulating operation for demodulating the frequency-modulated audio signal in a manner which will be described below is the sampling frequency of the sampling operation performed by the A/D converter 102 in accordance with the clock signal generated by the clock generator 103.

For example, if the frequency-modulated audio signal has a carrier frequency of 1.5 MHz and a frequency deviation of ±100 KHz, it is necessary to set the sampling frequency of the A/D converter 102 to a frequency greater than or equal to twice the maximum value of the frequency component contained in a signal to be demodulated (i.e., the frequency-modulated audio signal). Therefore, the sampling frequency needs to be greater than or equal to 3.2 MHz ((1.5 MHz+100 KHz)×2=3.2 MHz), for example, 4 MHz including a small margin.

If the signal outputted from the pre-filter 101 is sampled by the A/D converter 102 at the aforesaid sampling frequency of 4 MHz, a signal having the frequency spectrum shown in FIG. 2(c) is outputted from the A/D converter 102.

In FIG. 2(c), reference numeral 206 denotes the sampling frequency, and reference numeral 207 denotes the Nyquist frequency of the sampling frequency. The frequency 207 is ½ of the sampling frequency 206.

The sample pulse signal outputted from the A/D converter 102 is transmitted along two different paths, and the sample pulse signal transmitted along one path is directly supplied to a divider 105, while the sample pulse signal transmitted along the other path is supplied to the divider 105 after being phase-shifted by $\pi/2$ by a phase shifter 104.

If the sample pulse signal is represented as "A sinθ(t)" ("A" represents its amplitude), the signal passed through the phase shifter 104 is represented as "A cosθ(t)". The divider 105 performs a division using the supplied two signals and outputs a signal indicative of "A sinθ(t)/A cosθ(t) =tanθ(t)", and a signal indicative of "θ(t)" is obtained by passing the signal indicative of "A sinθ(t)/A cosθ(t)=tanθ(t)" through a $\tan^{-1}$ circuit 106.

If "ωc" is the angular frequency of the carrier of the frequency-modulated audio signal and "f(t)" is the frequency-demodulated audio signal, "θ(t)" is represented as "θ(t)=ωct+∫f(t)dt". Therefore, "dθ(t)/dt=ωc+f(t)" is obtained by passing the signal indicative of "θ(t)" through a differentiator 107. Then, a corrector 108 corrects "ωc" which corresponds to a D.C. component, and outputs the frequency-demodulated audio signal "f(t)".

However, the arrangement of the conventional demodulating apparatus described above has a number of disadvantages in that the frequency of the clock signal for controlling the operation of each of the parts in the demodulation processing block shown as the dashed-line frame in FIG. 1 is selected to be equal to the sampling frequency which is a frequency greater than or equal to twice the maximum value of the frequency component contained in the signal to be demodulated (i.e., the frequency-modulated audio signal). For example, since the amount of computational processing per unit time is large and it is, therefore, necessary to perform high-speed computational processing, the apparatus needs to be provided with a high-speed computational processing circuit which is extremely costly. If a digital signal processor or the like is used to construct the demodulation processing block, it will be extremely difficult to realize demodulation processing using software.

As one example of an apparatus for processing an information signal, there has heretofore been provided an apparatus which is arranged to reproduce a frequency-modulated information signal from a recording medium, on which the information signal is recorded in a frequency-modulated state, and demodulate the reproduced frequency-modulated information signal, as well as which has the function of detecting a dropout occurring in a reproduced frequency-modulated information signal owing to a defect or the like of the recording medium.

As is known in the art, the conventional information signal processing apparatus utilizes, for example, a method of detecting the occurrence of a dropout in a frequency-modulated information signal reproduced from a recording medium by detecting the envelope of the reproduced frequency-modulated information signal.

FIG. 3 is a block diagram of a conventional information signal processing apparatus, and schematically shows the arrangement of a so-called tan-type frequency-demodulating apparatus which is arranged to reproduce a frequency-modulated information signal from a recording medium and demodulate the reproduced frequency-modulated information signal, as well as which has the function of detecting the occurrence of a dropout in the reproduced frequency-modulated information signal.

Referring to FIG. 3, a reproduced frequency-modulated information signal which has been reproduced from a recording medium (not shown), such as a magnetic tape, by a reproducing head is transmitted into two different paths, and the signal transmitted along one path is directly supplied to a divider 302, while the signal transmitted along the other path is supplied to the divider 302 after being phase-shifted by $\pi/2$ by a phase shifter 301.

If the frequency-modulated information signal is represented as "A $\sin\theta(t)$" ("A" represents its amplitude), the signal passed through the phase shifter 301 is represented as "A $\cos\theta(t)$". The divider 302 performs a division using the supplied two signals and outputs a signal indicative of "A $\sin\theta(t)/A \cos\theta(t) = \tan\theta(t)$", and a signal indicative of "$\theta(t)$" is obtained by passing the signal indicative of "A $\sin\theta(t)/A \cos\theta(t) = \tan\theta(t)$" through a $\tan^{-1}$ circuit 303.

If "$\omega c$" is the angular frequency of the carrier of the frequency-modulated information signal and "f(t)" is the frequency-demodulated audio signal, "$\theta(t)$" is represented as "$\theta(t) = \omega ct + \int f(t)dt$". Therefore, "$d\theta(t)/dt = \omega c + f(t)$" is obtained by passing the signal indicative of "$\theta(t)$" through a differentiator 304. Then, a corrector 305 corrects "$\omega c$" which corresponds to a D.C. component, and outputs the frequency-demodulated information signal "f(t)".

The reproduced frequency-modulated information signal which has been reproduced from the recording medium (not shown), such as a magnetic tape, by the reproducing head is also supplied to an envelope detecting circuit 306.

The frequency-modulated information signal supplied to the envelope detecting circuit 306 is converted into an absolute value by an absolute-value circuit 307 and the absolute value is supplied to a hold circuit 308. The supplied absolute value is subjected to envelope detecting processing on the basis of a time constant determined by a coefficient "K" set in a coefficient multiplier 309.

FIGS. 4(a) to 4(d) are views showing signal waveforms formed by the respective parts in the envelope detecting circuit 306. If a frequency-modulated information signal having the waveform shown in FIG. 4(a) is supplied, the waveform of the frequency-modulated information signal is formed into the waveform shown in FIG. 4(b) by the absolute-value processing performed by the absolute-value circuit 307. The waveform shown in FIG. 4(b) is formed into the signal waveform shown by a solid line in FIG. 4(c) by the hold processing performed by the hold circuit 308.

The hold processing performed by the hold circuit 308 will be described below in detail with reference to FIG. 4(d).

The signal having the waveform, shown in FIG. 4(b), which has been subjected to the absolute-value processing in the absolute-value circuit 307 is supplied to a comparator 310 and a switch 311. In the comparator 310, the level of the presently supplied signal is compared with the level of a signal which was supplied previous to the presently supplied signal at an interval of a predetermined time set by the delay time of a delay element $Z^{-1}$.

If the level of the presently supplied signal is greater than the level of the signal which was supplied the predetermined time before, the switch 311 is connected to the terminal "a" shown in FIG. 3 so that the presently supplied signal is outputted to the succeeding stage via the delay element $Z^{-1}$ (an interval A in FIG. 4(d)). If the level of the presently supplied signal is smaller than the level of the signal which was supplied the predetermined time before, the switch 311 is connected to the terminal "b" shown in FIG. 3 so that the level of the presently supplied signal is gradually attenuated on the basis of the time constant determined by the coefficient "K" set in the coefficient multiplier 309 and the resultant signal of attenuated level is outputted to the succeeding stage via the delay element $Z^{-1}$ (an interval B in FIG. 4(d)). Incidentally, in FIG. 4(d) dashed lines indicate the waveform of the signal outputted from the absolute-value circuit 307.

The operations of constituent elements 312 to 316 of FIG. 3 will be described below with reference to FIGS. 5(a) to 5(c).

FIGS. 5(a) to 5(c) are views showing the relationships between the signal subjected to the hold processing outputted from the hold circuit 308, the level comparison signal outputted from the comparator 312 which will be described later, and a dropout detection signal outputted from the comparator 316 which will be described later. FIG. 5(a) shows the waveform of a signal which is obtained by passing a frequency-modulated information signal in which a dropout has occurred through the absolute-value circuit 307 and the hold circuit 308, FIG. 5(b) shows the waveform of the level comparison signal outputted from the comparator 312, and FIG. 5(c) shows the waveform of the dropout detection signal outputted from the comparator 316.

The signal which has been subjected to the hold processing in the hold circuit 308 of FIG. 3 is supplied to the comparator 312, in which the level of the supplied signal is compared with a reference level (corresponding to a level 501 in FIG. 5(a)) generated by a reference level generator 313. For example, if the level of the signal supplied from the hold circuit 308 is greater than the reference level, the comparator 312 outputs, as the level comparison signal, data indicative of "1" to a counter 314 provided at the succeeding stage. If the level of the supplied signal is smaller than the reference level, the comparator 312 outputs data indicative of "0" to the counter 314 as the level comparison signal (refer to FIG. 5(b)).

During the above-described operation, a clock pulse signal is supplied to the counter 314 from a clock generator 315. The counter 314 counts the number of pulses of the clock pulse signal supplied from the clock generator 315, during the interval that the data indicative of "0" is outputted from the comparator 312 (during an interval 502 in FIG. 5(b)). The counter 314 outputs count data indicative of the count value to the comparator 316 provided at the succeeding stage.

In the counter 316, the count data outputted from the counter 314 is compared with reference value data generated by a reference value data generator 317. For example, if the count data supplied from the counter 314 is smaller than the reference value data, the comparator 316 outputs data indicative of "0" as the dropout detection signal. If the count data is greater than the reference value data, the comparator 316 outputs data indicative of "1" as the dropout detection signal (refer to FIG. 5(c)) and resets the counting operation of the counter 314.

More specifically, in the above-described case, the count value obtained by causing the counter 314 to count the number of pulses during an interval indicated by 503 in FIG. 5(b) corresponds to the reference value data generated by the reference-value data generator 317, and an interval indicated by 504 in FIG. 5(c) is detected as the interval during which the dropout has occurred in the reproduced frequency-modulated information signal.

However, the arrangement of the above-described conventional information signal processing apparatus has a number of disadvantages. For example, it is necessary to provide a plurality of comparators as well as a reference level generator and a reference value data generator both of which serve to set parameters based on which the respective comparators perform their comparing operations. In addition, various circuits, such as an absolute-value circuit for performing absolute-value processing and a hold circuit for performing hold processing, are needed separately from a demodulating circuit for performing demodulation processing. As a result, a complicated, extremely costly circuit arrangement is needed.

As one example of an apparatus for subjecting an information signal to frequency-modulation processing and recording the frequency-modulated information signal on a recording medium, there has heretofore been provided an apparatus, such as a video tape recorder, which is arranged to subject an audio signal to frequency-modulation processing and record the audio signal on a magnetic tape in a frequency-modulated state.

FIG. 6 is a block diagram of a conventional information signal processing apparatus, and schematically shows one example of the arrangement of a frequency-modulating apparatus for subjecting an audio signal to frequency-modulation processing.

Referring to FIG. 6, an input audio signal is supplied to an analog/digital (A/D) converter 601. The A/D converter 601 performs sampling of the input audio signal, in accordance with a clock signal of predetermined frequency generated by a clock generator 604, thereby forming and outputting a sample pulse signal.

The clock signal generated by the clock generator 604 is also supplied to each part in a modulation processing block 602 shown as a dashed-line frame in FIG. 6. In the modulation processing block 602, the sample pulse signal is subjected to frequency-modulation processing which will be described later. The resultant signal is converted into an analog signal by a digital/analog (D/A) converter 603 which is also supplied with the clock signal generated by the clock generator 604, and the analog signal is outputted from the D/A converter 603.

It is to be noted that the frequency of the clock signal supplied from the clock generator 604 to each of the circuit blocks is set so that the frequency band of the frequency-modulated audio signal formed by the frequency-modulating apparatus becomes smaller than or equal to the Nyquist frequency.

For example, if the frequency-modulated audio signal has a carrier frequency of 1.5 MHz and a maximum frequency deviation of ±100 KHz, it is necessary to set the frequency of the clock signal generated by the clock generator 604 to a frequency greater than or equal to twice the maximum value of the frequency component contained in the frequency-modulated audio signal. Therefore, the frequency needs to be greater than or equal to 3.2 MHz ((1.5 MHz+100 KHz)×2=3.2 MHz), for example, 4 MHz including a small margin.

The frequency-modulating operation performed in the modulation processing block 602 of the frequency-modulating apparatus shown in FIG. 6 will be described below.

Referring to FIG. 6, a sample pulse signal "f(t)" outputted from the A/D converter 601 is multiplied by a coefficient "c1" in a coefficient multiplier 605, so that a sample pulse signal "c1·f(t)" is outputted from the coefficient multiplier 605. In a coefficient adder 606, a coefficient "c2" is added to the sample pulse signal "c1·f(t)", so that a sample pulse signal "c2+C1·f(t)" is outputted from the coefficient adder 606.

Then, the sample pulse signal outputted from the coefficient adder 606 is integrated by an integrator 607, whereby a sample pulse signal "∫(c2+c1·f(t))dt=c2·t+c1·∫f(t)dt" is formed. The sample pulse signal "∫(c2+c1·f(t))dt=c2·t+c1·∫f(t)dt" is modulated into a sample pulse signal "sin(c2·t+c1·∫f(t)dt)" which corresponds to the frequency-modulated audio signal, by a sin function circuit 608, and the sample pulse signal "sin(c2·t+c1·∫f(t)dt)" is supplied to the D/A converter 603 provided at the succeeding stage.

However, the arrangement of the above-described conventional frequency-modulating apparatus has a number of disadvantages in that the frequency of the clock signal for controlling the operation of each of the parts in the modulation processing block 602 shown as the dashed-line frame in FIG. 6 is set to a frequency greater than or equal to twice the maximum value of the frequency component contained in the frequency-modulated audio signal. For example, since the amount of computational processing per unit time is large and it is, therefore, necessary to perform high-speed computational processing, the apparatus needs to be provided with a high-speed computational processing circuit which is extremely costly. If a digital signal processor or the like is used to construct the modulation processing block 602, it will be extremely difficult to realize modulation processing using software.

FIG. 8 shows another example of the conventional frequency-modulating apparatus. As shown, a preprocessing circuit 802 and other circuit elements are provided at a stage preceding the modulation processing block 602. An A/D converter 801, to which an audio signal is supplied, and the preprocessing circuit 802 are arranged to operate in accordance with a clock signal of frequency 40 KHz which is formed, for example, by dividing the frequency of a clock signal of frequency 4 MHz outputted from the clock generator 604 by a frequency divider 804. In such an arrangement, it is necessary to insert an interpolation filter 803 between the preprocessing circuit 802 and the modulation processing block 602 in order to increase the sampling frequency of the sample pulse signal outputted from the preprocessing circuit 802. However, the frequency of the operating clock signal of each of the A/D converter 801 and the preprocessing circuit 802 (i.e., 40 KHz) and the frequency of the operating clock signal of the modulation processing block 602 (i.e., 4 MHz) exhibit a large ratio (i.e., 1:100). As a result, the circuit scale of the interpolation filter 803 becomes large to incur an increase in cost.

SUMMARY OF THE INVENTION

It is, therefore, an object of the present invention to provide an information signal processing apparatus which makes it possible to solve the above-described problems.

Another object of the present invention is to provide an information signal processing apparatus in which since the amount of computation per unit time is reduced, a low-speed computing processing circuit can be used to process an information signal.

To achieve the above-described objects, in accordance with one aspect of the present invention, there is provided an information signal processing apparatus for processing an information signal, which comprises sampling means for receiving as its input a frequency-modulated information signal having a predetermined frequency band, forming a sample pulse signal by sampling the input frequency-modulated information signal in accordance with a clock signal having a first frequency which is selected so that a frequency which is n times (n is a positive integer) a frequency of half the first frequency is positioned in a frequency band lower than the frequency band of the input frequency-modulated information signal and so that a frequency which is (n+1) times (n is a positive integer) the frequency of half the first frequency is positioned in a frequency band higher than the frequency band of the input frequency-modulated information signal, and outputting the sample pulse signal, and sample pulse signal computing processing means for performing computing processing of the sample pulse signal outputted from the sampling means, in accordance with the clock signal having the first frequency.

Another object of the present invention is to provide an information signal processing apparatus having an arrangement which can be reduced in complexity and cost.

To achieve the above object, in accordance with another aspect of the present invention, there is provided an information signal processing apparatus for processing an information signal, which comprises first sampling means for receiving as its input a frequency-modulated information signal having a predetermined frequency band, forming a first sample pulse signal by sampling the input frequency-modulated information signal in accordance with a first clock signal having a frequency not less than twice a maximum value of a frequency component of the frequency-modulated information signal, and outputting the first sample pulse signal, second sampling means for receiving as its input the first sample pulse signal outputted from the first sampling means, forming a second sample pulse signal by sampling the input first sample pulse signal in accordance with a second clock signal having a first frequency which is selected so that a frequency which is n times (n is a positive integer) a frequency of half the first frequency is positioned in a frequency band lower than the frequency band of the input frequency-modulated information signal and so that a frequency which is (n+1) times (n is a positive integer) the frequency of half the first frequency is positioned in a frequency band higher than the frequency band of the input frequency-modulated information signal, and outputting the second sample pulse signal, and sample pulse signal computing processing means for performing computing processing of the second sample pulse signal outputted from the second sampling means, in accordance with the second clock signal having the first frequency.

Another object of the present invention is to provide an information signal processing apparatus in which since the amount of computation per unit time is reduced, a low-speed computing processing circuit can be used to process an information signal so that the complexity and cost of the apparatus can be reduced.

To achieve the above-described objects, in accordance with another aspect of the present invention, there is provided an information signal processing apparatus for processing an information signal, which comprises first sampling means for receiving as its input an information signal, forming a sample signal by sampling the input information signal in accordance with a clock signal having a first frequency, and outputting the sample signal, signal processing means for performing signal processing of the sample signal outputted from the first sampling means and outputting a sample signal indicative of a result of the signal processing, second sampling means for forming a re-sample signal by re-sampling the sample signal outputted from the signal processing means, in accordance with a clock signal having a second frequency which is n times the first frequency (n is a positive integer of n≧2), and outputting the re-sample signal, and filter means for extracting and outputting a high-frequency component of the re-sample signal outputted from the second sampling means.

Another object of the present invention is to provide an information signal processing apparatus capable of accurately demodulating a frequency-modulated information signal by means of a simple and low-cost arrangement and of accurately detecting a dropout occurring in the frequency-modulated information signal.

To achieve the above-described objects, in accordance with another aspect of the present invention, there is provided an information signal processing apparatus for processing an information signal, which comprises phase shifting means for receiving as its input a frequency-modulated information signal, shifting a phase of the input frequency-modulated information signal by $\pi/2$ and outputting the frequency-modulated information signal shifted by $\pi/2$ in phase, division means for receiving as one input the frequency-modulated information signal and as another input the frequency-modulated information signal outputted from the phase shifting means and shifted by $\pi/2$ in phase with respect to the input frequency-modulated information signal, dividing the input frequency-modulated information signal by the frequency-modulated information signal outputted from the phase shifting means and shifted by $\pi/2$ in phase, and outputting a signal indicative of a division result, and dropout detecting means for checking a state of the signal outputted from the division means and detecting on the basis of a check result whether a dropout has occurred in the input frequency-modulated information signal.

The above and other objects, features and advantages of the present invention will become apparent from the following detailed description of preferred embodiments of the present invention, taken in conjunction with the accompanying drawings.

BRIEF DESCRIPTION OF THE DRAWINGS

FIG. 6 is a block diagram of a conventional information signal processing apparatus, schematically showing one example of the arrangement of a frequency-modulating apparatus for frequency-modulating an audio signal;

FIGS. 10(a) and 10(b) are views showing the output waveforms of clock signals formed in the demodulating apparatus shown in FIG. 9;

FIGS. 11(a) and 11(b) are views showing the frequency spectra of signals formed by the respective parts of the demodulating apparatus shown in FIG. 9;

FIGS. 13(a) and 13(b) are views showing the waveforms of sample pulse signals formed in the demodulating apparatus shown in FIG. 12;

FIGS. 14(a) to 14(c) are views showing the frequency spectra of signals formed by the respective parts of the demodulating apparatus shown in FIG. 12;

FIG. 15 is a block diagram of a third embodiment of the present invention, schematically showing the arrangement of an information signal processing apparatus having a dropout detecting function to which the present invention is applied;

FIGS. 16(a) to 16(d) are views showing signal waveforms formed by the respective parts in the information signal processing apparatus shown in FIG. 15, for the purpose of explanation of the operation of the information signal processing apparatus shown in FIG. 15;

FIGS. 17(a) to 17(c) are views showing signal waveforms formed by the respective parts in the information signal processing apparatus shown in FIG. 15, for the purpose of explanation of a dropout detecting operation performed in the information signal processing apparatus shown in FIG. 15;

FIGS. 21(a) to 21(c) are views showing the frequency spectra of the signals formed by the respective parts in the frequency-modulating apparatus shown in FIG. 18.

DETAILED DESCRIPTION OF THE PREFERRED EMBODIMENTS

Preferred embodiments of the present invention will be described below with reference to the accompanying drawings.

Figure 9:
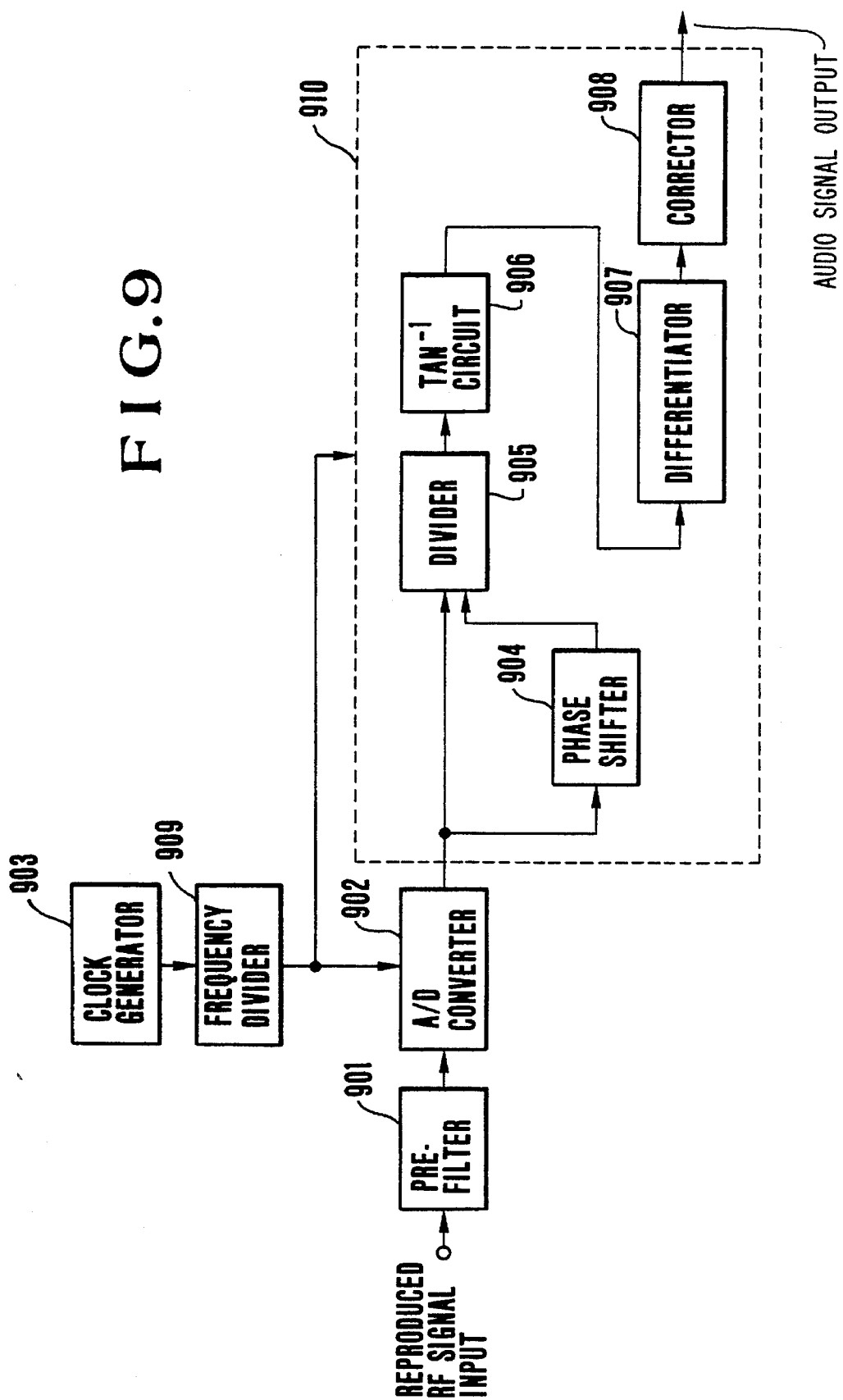
FIG. 9 is a block diagram of a first embodiment of the present invention, schematically showing the arrangement of a demodulating apparatus to which the present invention is applied.

FIG. 9 is a block diagram of a first embodiment of the present invention and schematically shows the arrangement of a demodulating apparatus to which the present invention is applied.

Figure 1:
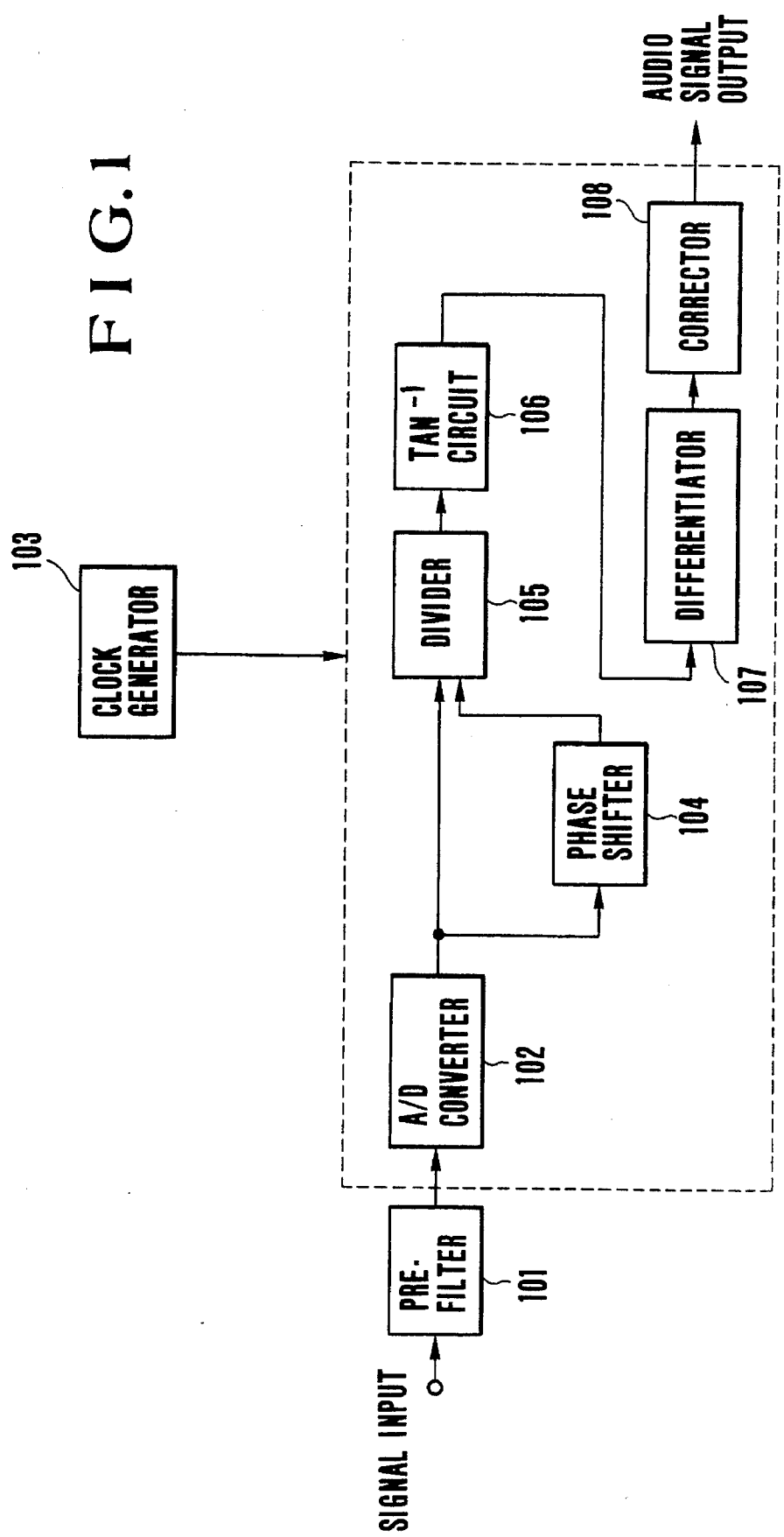
FIG. 1 is a block diagram of a conventional information signal processing apparatus, schematically showing one example of the arrangement of a demodulating apparatus for demodulating a frequency-modulated audio signal reproduced from a recording medium.
Figure 2A:
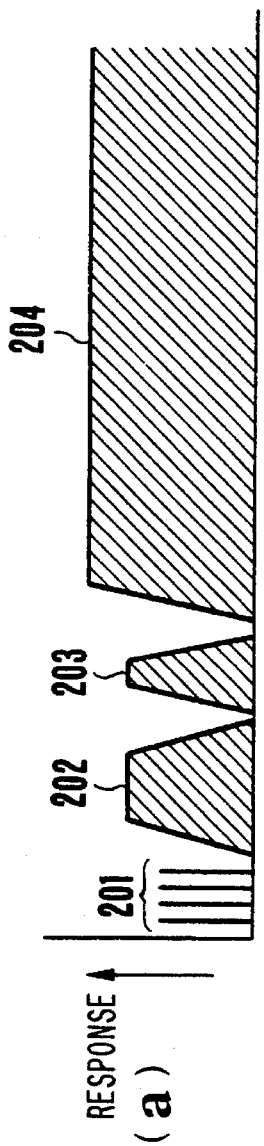
FIGS. 2(a) to 2(c) are views showing the frequency spectra of signals formed by the respective parts of the demodulating apparatus shown in FIG. 1.
Figure 2B:
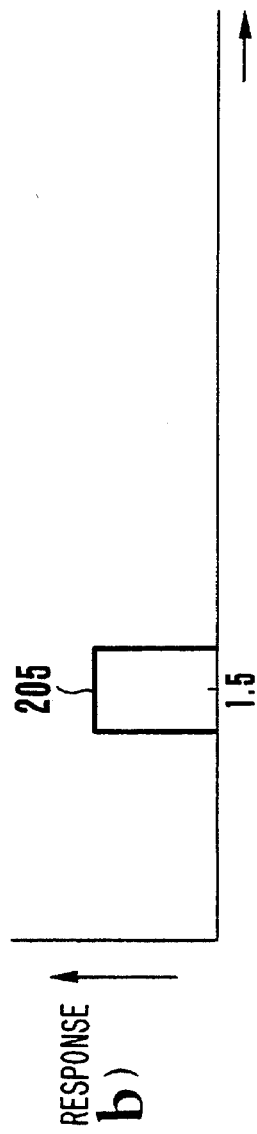
Figure 2C:
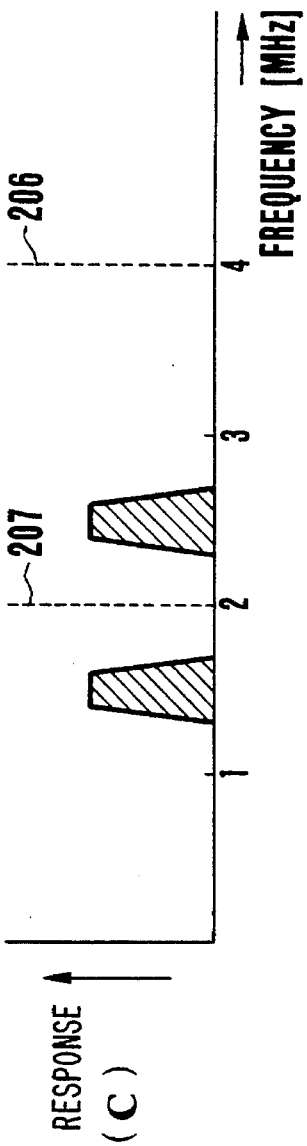
Figure 3:
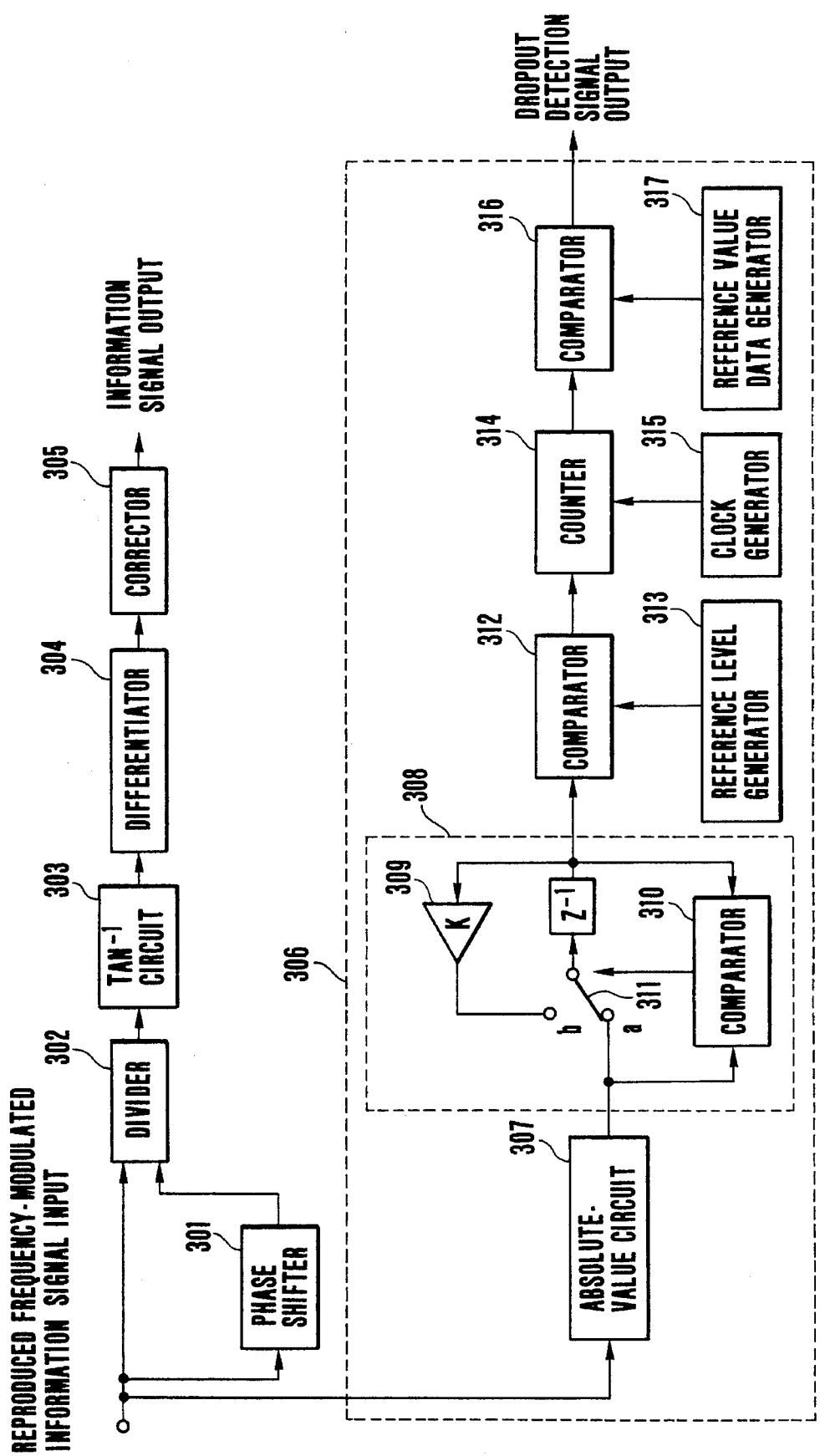
FIG. 3 is a block diagram of a conventional information signal processing apparatus, schematically showing the arrangement of a so-called tan-type frequency-demodulating apparatus which is arranged to reproduce a frequency-modulated information signal from a recording medium and demodulate the reproduced frequency-modulated information signal, as well as which has the function of detecting the occurrence of a dropout in the reproduced frequency-modulated information signal.
Figure 4A:
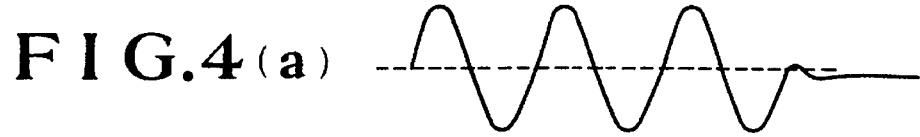
FIGS. 4(a) to 4(d) are views showing signal waveforms formed by the respective parts of the frequency-demodulating apparatus shown in FIG. 3, for the purpose of explanation of a hold processing operation performed in the apparatus.
Figure 4B:
Figure 4C:
Figure 4D:
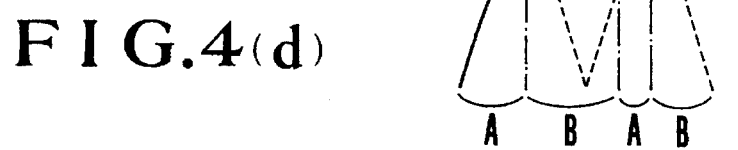
Figure 5A:
FIGS. 5(a) to 5(c) are views showing signal waveforms formed by the respective parts of the frequency-demodulating apparatus shown in FIG. 3, for the purpose of explanation of a dropout detecting operation performed in the apparatus.
Figure 5B:
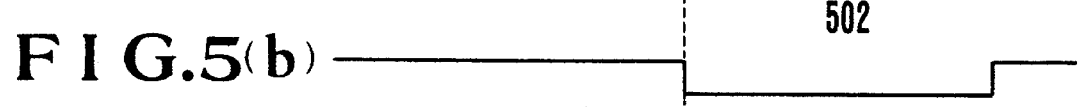
Figure 5C:

Referring to FIG. 9, a clock generator 903 generates a clock signal of frequency 4 MHz similarly to the previously-described clock generator 103 of the conventional demodulating apparatus shown in FIG. 1. A frequency divider 909 divides the frequency of the generated clock signal by two, thereby forming a clock signal of frequency 2 MHz. The clock signal is supplied to an A/D converter 902 as a sampling clock signal for a frequency-modulated audio signal separated from a reproduced RF signal by a pre-filter 901. The clock signal is further supplied, as a demodulation processing control clock signal, to each part in a demodulation processing block shown as a dashed-line frame 910 in FIG. 9.

FIG. 10(a) shows the output waveform of the clock signal of frequency 4 MHz which is generated by the clock generator 903, and FIG. 10(b) shows the output waveform of the clock signal of frequency 2 MHz which is outputted from the frequency divider 909.

FIGS. 11(a) and 11(b) show the frequency spectra of signals formed in the respective parts.

In FIG. 11(a), a signal 1101 represents the frequency-modulated audio signal supplied from the pre-filter 901 to the A/D converter 902, and has a frequency component represented by a Bessel function centered at a carrier frequency 1102.

In the present embodiment, a frequency 1103 is selected to be 1/n times the sub-Nyquist frequency (n is a positive integer not less than 2) and is positioned in a frequency band lower than the frequency band of the frequency-modulated audio signal, and a frequency 1104 is selected to be the sub-Nyquist frequency and is positioned in a frequency band higher than the frequency band of the frequency-modulated audio signal. The clock signal outputted from the frequency divider 909 is selected to have a frequency equal to the frequency 1104.

For example, if n=2, the frequency 1103 becomes ½ the sub-Nyquist frequency, and the frequency 1104 is selected to be the frequency of the sampling clock signal 1105 set at the sub-Nyquist frequency as shown in FIG. 11(b). If the frequency-modulated audio signal is sampled by driving the A/D converter 902 in accordance with the sampling clock signal 1105, the frequency spectrum of the sample pulse signal outputted from the A/D converter 902 takes the state shown in FIG. 11(b), i.e., the frequency-modulated audio signal is symmetrically folded about the sub-Nyquist frequency 1104.

If the frequency of the sampling clock signal is to be set in the above-described manner, it is preferable to fully attenuate the frequency components of the reproduced RF signal below the frequency 1103 and above the frequency 1104 by means of the pre-filter 901.

It is to be noted that the frequency spectrum shown in FIG. 11(b) can be considered equivalent to the frequency spectrum of the sample pulse signal obtained by sampling a frequency-modulated audio signal 1107 of a carrier frequency 1106 in accordance with the sampling clock signal 1105. Accordingly, if the sample pulse signal obtained by driving the A/D converter 902 in accordance with the sampling clock signal 1105 is demodulated by a demodulation processing circuit in accordance with the clock signal of frequency 1104, a demodulated signal equivalent to the demodulated signal obtained from the conventional demodulating apparatus can be obtained by means of a low-cost demodulation processing circuit which operates with a clock signal of frequency lower than that used in the conventional demodulating apparatus.

In the above-described case, if "A" indicates the frequency of the sampling clock signal 1105; "B" indicates the carrier frequency 1102 of the frequency-modulated audio signal 1101 supplied from the pre-filter 901; and "C" indicates the carrier frequency 1106 of the frequency-modulated audio signal 1107 which is placed in the folded state by sampling, then "C=A−B" is obtained. In the present embodiment, since "A"=2 MHz and "B"=1.5 MHz, "C"=500 KHz is obtained.

Since the operation of each part in the demodulation processing block 910 of FIG. 9 is similar to that explained in connection with the conventional demodulating apparatus, detailed description is omitted herein.

To clarify the distinction between the first embodiment and the conventional demodulating apparatus, the above description has referred to the arrangement in which the clock signal generated by the clock generator 903 is frequency-divided by using the frequency divider 909 and the resultant signal is supplied to the A/D converter 902 and to each of the parts in the demodulation processing block 910. However, it is also possible to adopt an arrangement in which a clock signal of frequency 2 MHz is generated by the clock generator 903 and supplied to the A/D converter 902 and to each of the parts in the demodulation processing block 910 without the use of the frequency divider 909.

As described above, the demodulating apparatus according to the first embodiment of the present invention is arranged to receive an input frequency-modulated audio signal and obtain a sample pulse signal by sampling the input frequency-modulated audio signal in accordance with a sampling clock signal having a frequency which is selected so that a frequency of 1/n times the sub-Nyquist frequency (n is a positive integer not less than 2) is positioned in a frequency band lower than the frequency band of the frequency component of the frequency-modulated audio signal having the sub-Nyquist frequency. The thus-obtained sample pulse signal is subjected to demodulating processing in accordance with a clock signal having a frequency equivalent to the frequency of the sampling clock signal. According to the above-described arrangement, it is possible to reduce the amount of computational processing per unit time, thereby permitting the use of a low-speed computational processing circuit to perform demodulation processing of the frequency-modulated audio signal. Accordingly, it is possible to reduce the complexity and cost of the apparatus.

Figure 12:
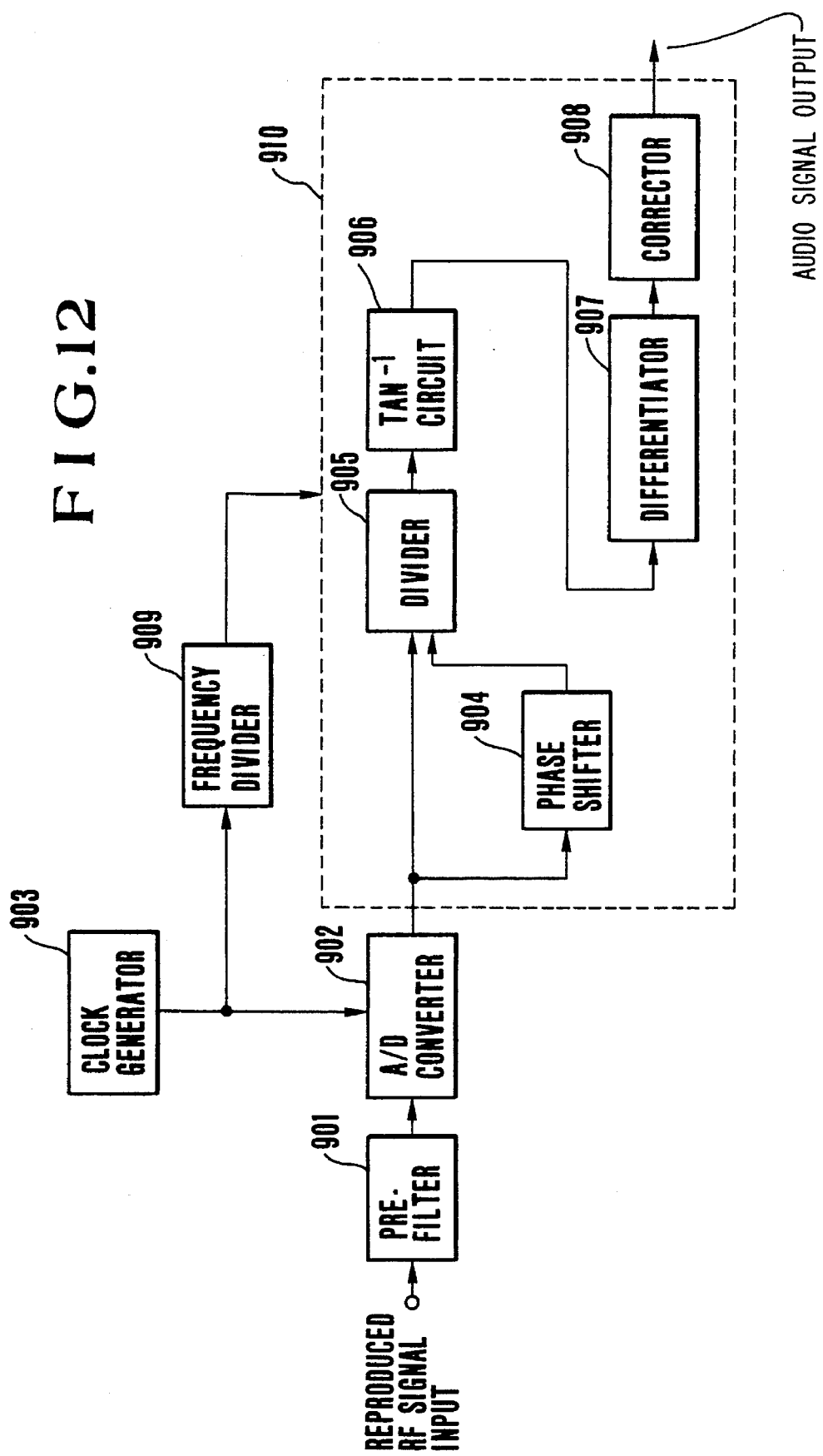
FIG. 12 is a block diagram of a second embodiment of the present invention, schematically showing the arrangement of a demodulating apparatus to which the present invention is applied.

FIG. 12 is a block diagram of a second embodiment of the present invention and schematically shows the arrangement of a demodulating apparatus to which the present invention is applied. In FIG. 12, the same reference numerals are used to denote constituent elements which are similar to those of the first embodiment shown in FIG. 9.

Referring to FIG. 12, the clock generator 903 generates a clock signal of frequency 4 MHz similarly to the previously-described clock generator 103 of the conventional demodulating apparatus shown in FIG. 1, and the generated clock signal is transmitted along two different paths. The clock signal transmitted along one path is supplied to the A/D converter 902 as a sampling clock signal for a frequency-modulated audio signal separated from a reproduced RF signal by the pre-filter 901. The clock signal transmitted along the other path is supplied to the frequency divider 909, which divides the frequency of the clock signal by two, thereby forming a clock signal of frequency 2 MHz. The clock signal is supplied, as a demodulation processing control clock signal, to each of the parts in the demodulation processing block shown as the dashed-line frame 910 in FIG. 12.

FIG. 10(*a*) shows the output waveform of the clock signal of frequency 4 MHz which is generated by the clock generator 903, and FIG. 10(*b*) shows the output waveform of the clock signal of frequency 2 MHz which is outputted from the frequency divider 909.

If the frequency-modulated audio signal is sampled with a period of 4 MHz by operating the A/D converter 902 in accordance with a sampling clock signal of frequency 4 MHz in the above-described manner, the sample pulse signal outputted from the A/D converter 902 exhibits the waveform shown in FIG. 13(*a*). Also, if demodulation processing is conducted with a period of 2 MHz by operating each of the parts in the demodulation processing block 910 in accordance with a demodulation processing control clock signal of frequency 2 MHz, the sample pulse signal obtained through the processing performed by each of the parts in the demodulation processing block 910 exhibits the waveform shown in FIG. 13(*b*).

More specifically, although the A/D converter 902, which precedes the demodulation processing block 910, outputs a sample pulse signal with a sampling period of 4 MHz as shown in FIG. 13(*a*), the sample pulse signal outputted from the A/D converter 902 is subjected to demodulation processing with a period of 2 MHz, which is half the sampling period, by each of the parts in the succeeding demodulation processing block 910. Accordingly, the sample pulse signal which is outputted from the A/D converter 902 with the sampling period of 4 MHz is processed on alternate basis, and the sample pulse signal processed by each of the parts in the demodulation processing block 910 is formed as shown in FIG. 13(*b*). The above-described processing is equivalent to the processing of subjecting the sample pulse signal outputted from the A/D converter 902 with the sampling period of 4 MHz to re-sampling with a sampling period of 2 MHz which is the operating period of the demodulation processing block 910.

The frequency spectra of the signals formed in the respective parts shown in FIG. 12 are shown in FIGS. 14(*a*) to 14(*c*). The frequency-modulated audio signal supplied from the pre-filter 901 to the A/D converter 902 has a frequency component represented by a Bessel function centered at a carrier frequency of 1.5 MHz, as shown in FIG. 14(*a*). Also, the sample pulse signal outputted from the A/D converter 902, which samples the frequency-modulated audio signal in accordance with the sampling clock signal of frequency 4 MHz, exhibits the frequency spectrum shown in FIG. 14(*b*), i.e., the frequency-modulated audio signal is symmetrically folded about a sub-Nyquist frequency 1401 of 2 MHz.

The sample pulse signal outputted from the succeeding demodulation processing block 910, in which demodulation processing is performed by the respective parts in accordance with the demodulation processing control clock signal of frequency 2 MHz, exhibits the frequency spectrum shown in FIG. 14(*c*), i.e., since the frequency component of the sample pulse signal before re-sampling is not less than 1 MHz as described above, the signal is folded about a sub-Nyquist frequency 1402 of 1 MHz toward its lower-frequency side as well by re-sampling.

It is to be noted that the carrier frequency of the signal component folded toward the lower-frequency side about the sub-Nyquist frequency 1402 of 1 MHz by re-sampling is equivalent to a frequency of 500 KHz.

If the frequency for re-sampling is to be set as described above, it is preferable to fully attenuate the frequency components of the reproduced RF signal below the frequency 1402 and above the frequency 1401 by means of the pre-filter 901.

It is to be noted that the frequency spectrum shown in FIG. 14(c) can be considered equivalent to the frequency spectrum of the sample pulse signal obtained by sampling the frequency-modulated audio signal of carrier frequency 500 KHz in accordance with the sampling clock signal of frequency 2 MHz. Accordingly, if the sample pulse signal obtained by driving the A/D converter 902 in accordance with the sampling clock signal of frequency 4 MHz is demodulated by a demodulation processing circuit in accordance with the clock signal of 2 MHz, it is possible to cause the demodulation processing circuit to operate with a clock signal of frequency lower than that used in the conventional demodulating apparatus, thereby reducing the amount of computational processing per unit time. Further, a demodulated signal equivalent to the demodulated signal obtained from the conventional demodulating apparatus can be obtained with a clock signal of frequency lower than that used in the conventional demodulating apparatus.

Since the operation of each of the parts in the demodulation processing block 910 shown in FIG. 12 is similar to that explained in connection with the conventional demodulating apparatus, detailed description is omitted herein.

As described above, the demodulating apparatus according to the second embodiment of the present invention is arranged to receive an input frequency-modulated audio signal, obtain a sample pulse signal by sampling the input frequency-modulated audio signal in accordance with a sampling clock signal having a predetermined frequency, and subject the sample pulse signal to demodulation processing in accordance with a clock signal having a frequency 1/n (n is a positive integer) of the frequency of the sampling clock signal. According to the above-described arrangement, a circuit for performing the demodulation processing can be made to operate with a clock signal of low frequency, whereby it is possible to reduce the amount of computational processing per unit time and it is also possible to use, a low-speed computational processing circuit to perform demodulation processing of the frequency-modulated audio signal. Accordingly, it is possible to reduce the complexity and cost of the apparatus. If a digital signal processor or the like is used to construct the circuit for performing the demodulation processing, it is possible to easily realize demodulation processing using software.

FIG. 15 is a block diagram of a third embodiment of the present invention and schematically shows the arrangement of an information signal processing apparatus having a dropout detecting function to which the present invention is applied.

Referring to FIG. 15, a reproduced frequency-modulated information signal which has been reproduced from a recording medium (not shown), such as a magnetic tape, by a reproducing head is transmitted along two different paths, and the signal transmitted along one path is directly supplied to a divider 1502, while the signal transmitted along the other path is supplied to the divider 1502 after being phase-shifted by $\pi/2$ by a phase shifter 1501.

If the frequency-modulated information signal is represented as "$A \sin\theta(t)$" ("A" represents its amplitude), the signal passed through the phase shifter 1501 is represented as "$A \cos\theta(t)$". The divider 1502 performs a division using the supplied two signals and outputs a signal indicative of "$A \sin\theta(t)/A \cos\theta(t)=\tan\theta(t)$", and a signal indicative of "$\theta(t)$" is obtained by passing the signal indicative of "$A \sin\theta(t)/A \cos(t)=\tan\theta(t)$" through a $\tan^{-1}$ circuit 1503.

If "$\omega c$" is the angular frequency of the carrier of the frequency-modulated information signal and "$f(t)$" is the frequency-demodulated audio signal, "$\theta(t)$" is represented as "$\theta(t)=\omega ct+\int f(t)dt$". Therefore, "$d\theta(t)/dt=\omega c+f(t)$" is obtained by passing the signal indicative of "$\theta(t)$" through a differentiator 1504. Then, a corrector 1505 corrects "$\omega c$" which corresponds to a D.C. component, and outputs the frequency-demodulated information signal "$f(t)$".

FIGS. 16(a) to 16(d) are views showing signal waveforms formed by the respective parts in the information signal processing apparatus shown in FIG. 15. If a frequency-modulated information signal having the signal waveform shown in FIG. 16(a) is inputted into the apparatus shown in FIG. 15, a signal having the waveform shown in FIG. 16(b) is outputted from the phase shifter 1501, and a signal having the waveform shown in FIG. 16(c) is outputted from the divider 1502.

As shown in FIG. 16(c), the waveform of the signal outputted from the divider 1502 exhibits a waveform corresponding to a tan function. Since the tan function is a function which produces levels ranging between $-\infty$ and $\infty$, if no dropout has occurred in the frequency-modulated information signal inputted into the apparatus, the level of the signal outputted from the divider 1502 overflows at intervals of a period "$\pi$".

It is to be noted that the divider 1502 used in the third embodiment is arranged to generate an overflow pulse indicative of an overflow state during the interval that the signal outputted from the divider 1502 is in the overflow state. If no dropout has occurred in the frequency-modulated information signal inputted into the apparatus, the overflow pulse is generated by the divider 1502 at intervals of the period "$\pi$" as shown in FIG. 16(d).

FIGS. 17(a) to 17(c) are views showing the signal waveforms formed by the respective parts of the apparatus, for the purpose of aiding in explaining the dropout detecting operation performed in the information signal processing apparatus shown in FIG. 15. The dropout detecting operation, which is performed in a case where the waveform of a frequency-modulated information signal inputted into the information signal processing apparatus according to the third embodiment shown in FIG. 15 is partially deformed due to a dropout or the like, will be described below in detail with reference to FIGS. 17(a) to 17(c).

FIG. 17(a) is a view showing the waveform of the signal outputted from the phase shifter 1501, and shows the state in which a dropout occurs at the timing indicated at 1701 in FIG. 17(a) and the waveform starts to be deformed.

Since the signal outputted from the phase shifter 1501 is a signal which serves as a denominator in the division processing performed by the succeeding divider 1502, if the signal shown in FIG. 17(a) is supplied to the divider 1502, the overflow pulse generated by the divider 1502 is continuously held in a high-level state indicative of the occurrence of the overflow subsequently to the timing, indicated by 1702 in FIG. 17(b), at which a deformation due to the dropout occurs in the signal waveform.

The overflow pulse generated by the divider 1502 is supplied to a counter 1507 of FIG. 15. The counter 1507 counts the number of pulses of the clock pulse signal supplied from a clock generator 1510, during the interval that the supplied overflow pulse is held in the high-level state, and outputs count data indicative of the count value to a comparator 1508 provided at the succeeding stage.

The counter 1507 is arranged to reset its counting operation at the timing when the overflow pulse supplied from the divider 1502 changes from a high-level state to a low-level state.

The count data outputted from the counter 1507 is supplied to the comparator 1508, in which the count data is compared with a reference-value data generated by a reference-value data generator 1509. For example, if the count data supplied from the counter 1507 is smaller than the reference-value data, the comparator 1508 outputs data indicative of "0" as a dropout detection signal. If the count data supplied from the counter 1507 is greater than the reference-value data, the comparator 1508 outputs data indicative of "1" as a dropout detection signal.

More specifically, in the above-described case, an interval indicated by 1703 of the dropout detection signal shown in FIG. 17(c) is detected as the interval during which the dropout has occurred in the reproduced frequency-modulated information signal.

As described above, in the information signal processing apparatus according to the third embodiment, a frequency-modulated information signal is reproduced from a recording medium on which the frequency-modulated information signal is recorded, the reproduced frequency-modulated information signal is inputted, and the input frequency-modulated information signal is demodulated by using a signal obtained by dividing, by a division circuit, the frequency-modulated information signal by a signal obtained by phase-shifting the frequency-modulated information signal by $\pi/2$. In the demodulation processing, the interval during which an overflow has occurred in the signal outputted from the division circuit is detected by a counter, and the count value provided by the counter is compared with a predetermined reference value by a comparator, so that a dropout which has occurred in the frequency-modulated information signal inputted into the apparatus is detected on the basis of the comparison result. According to the above-described arrangement, since there is no need for an absolute-value circuit for performing absolute-value processing, a hold circuit for performing hold processing or the like which would have been needed for the conventional apparatus, it is possible to realize a circuit having a comparatively small-scale arrangement made up of, for example, a counter and a single comparator, Further, since it is only necessary to use a single reference data generator for setting a parameter based on which the comparator makes a comparison, it is possible to reduce the cost of the apparatus.

Figure 18:
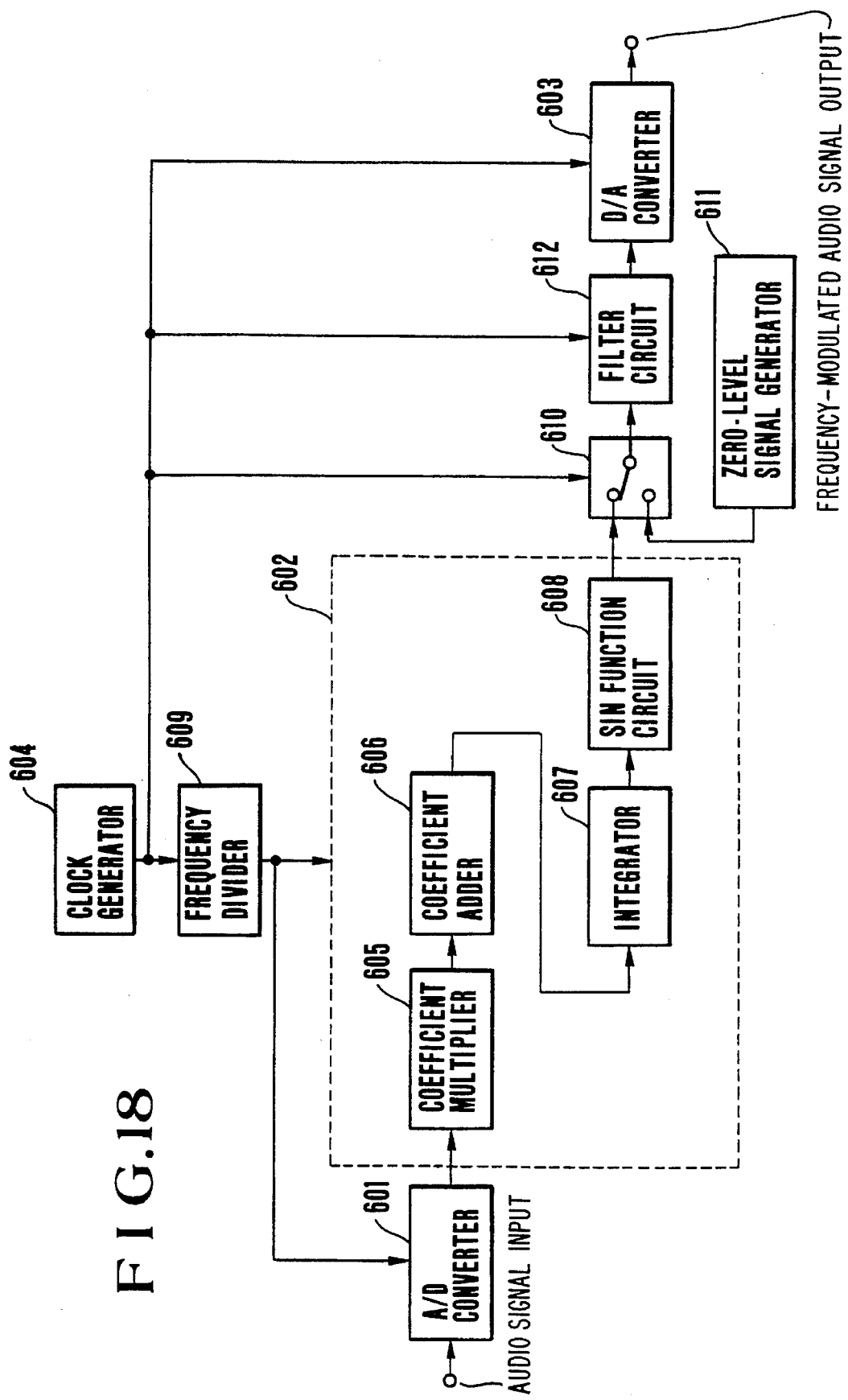
FIG. 18 is a block diagram of a fourth embodiment of the present invention, schematically showing the arrangement of a frequency-modulating apparatus to which the present invention is applied.

FIG. 18 is a block diagram of a fourth embodiment of the present invention and schematically shows the arrangement of a frequency-modulating apparatus to which the present invention is applied. In FIG. 18, the same reference numerals are used to denote constituent elements which are similar to those shown in FIG. 6.

Referring to FIG. 18, the clock generator 604 generates a clock signal of frequency 4 MHz similarly to the previously-described clock generator 604 of the conventional frequency-modulating apparatus shown in FIG. 6, and the generated clock signal is transmitted along two different paths. The clock signal transmitted along one path is supplied to each of the D/A converter 603, a switch 610 and a filter circuit 612 as an operation control clock signal. The clock signal transmitted along the other path is supplied to a frequency divider 609, which divides the frequency of the clock signal by two, thereby forming a clock signal of frequency 2 MHz. The clock signal is supplied to the A/D converter 601 as a sampling clock signal for an input audio signal and, as a modulation processing control clock signal, to each of the parts in a modulation processing block shown as the dashed-line frame 602 in FIG. 18.

Figure 19A:
FIGS. 19(a) and 19(b) are views showing the waveforms of clock signals in the frequency-modulating apparatus shown in FIG. 18.
Figure 19B:

FIG. 19(a) shows the output waveform of the clock signal of frequency 4 MHz which is generated by the clock generator 604, and FIG. 10(b) shows the output waveform of the clock signal of frequency 2 MHz which is outputted from the frequency divider 609.

In FIG. 18, a sample pulse signal formed by sampling the input audio signal by the A/D converter 610 in accordance with the clock signal of frequency 2 MHz outputted from the frequency divider 609 is subjected to frequency-modulation processing in the succeeding modulation processing block 602. The modulation processing block 602 according to the fourth embodiment subjects the sample pulse signal, which has been inputted in accordance with the clock signal of frequency 2 MHz outputted from the frequency divider 609, to the frequency-modulation processing in such a manner that its carrier frequency is set to 500 KHz.

Since the operation of each of the parts in the modulation processing block 602 of FIG. 18 is similar to that explained in connection with the modulation processing block 602 of the conventional frequency-modulating apparatus shown in FIG. 6, detailed description is omitted herein.

One input terminal of the switch 610 is supplied with the sample pulse signal which has been subjected to the frequency-modulation processing in the modulation processing block 602, while the other input terminal of the switch 610 is supplied with a pulse signal indicative of a zero level which is generated by a zero-level signal generator 611. The switching operation of the switch 610 is controlled in accordance with the clock signal of frequency 4 MHz outputted from the clock generator 604, so that the pulse signals supplied to both input terminals are alternately outputted to the succeeding filter circuit 612.

Figure 20A:
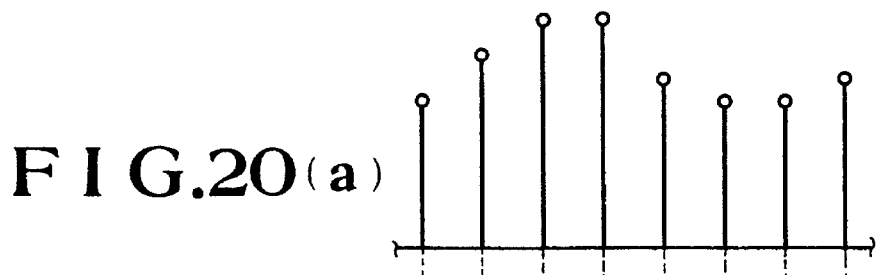
FIGS. 20(a) to 20(d) are views showing the waveforms of sample pulse signals formed by the respective parts in the frequency-modulating apparatus shown in FIG. 18.
Figure 20B:
Figure 20C:
Figure 20D:

FIGS. 20(a) to 20(d) are views showing the waveforms of the respective input and output signals of the switch 610. FIG. 20(a) shows the waveform of the sample pulse signal subjected to the frequency-modulation processing, which is outputted from the modulation processing block 602. FIG. 20(b) shows the waveform of the clock signal of frequency 2 MHz which is outputted from the frequency divider 609. FIG. 20(c) shows the waveform of the sample pulse signal outputted from the switch 610. FIG. 20(d) shows the waveform of the clock signal of frequency 4 MHz which is outputted from the clock generator 604.

Accordingly, the sample pulse signal outputted from the switch 610 is equivalent to a sample pulse signal obtained by re-sampling, by the switch 610, the sample pulse signal subjected to the frequency-modulation processing which is outputted from the preceding modulation processing block 602 operating in accordance with the clock signal of frequency 2 MHz, in accordance with the clock signal of frequency 4 MHz.

The sample pulse signal outputted from the switch 610 is supplied to the succeeding filter circuit 612, in which the supplied signal is subjected to filter processing in accordance with the clock signal of frequency 4 MHz outputted from the clock generator 604.

FIG. 21(*a*) is a view showing a frequency spectrum below the sub-Nyquist frequency (i.e., 2 MHz) of the sample pulse signal supplied from the switch 610 to the filter circuit 612 operating in accordance with the clock signal of frequency 4 MHz. In FIG. 21(*a*), reference numeral 2101 denotes a frequency-modulated audio signal component of carrier frequency 500 KHz, and reference numeral 2102 denotes a signal component obtained by symmetrically folding the frequency-modulated audio signal component 2101 about 1 MHz.

FIG. 21(*b*) is a view showing the characteristic of the filter circuit 612. As shown, the filter circuit 612 shows a highpass filter characteristic, and as shown in FIG. 21(*c*), the filter circuit-612 outputs a sample pulse signal of the signal component 2101 obtained by symmetrically folding the frequency-modulated audio signal component 2101 about 1 MHz.

Figure 7:
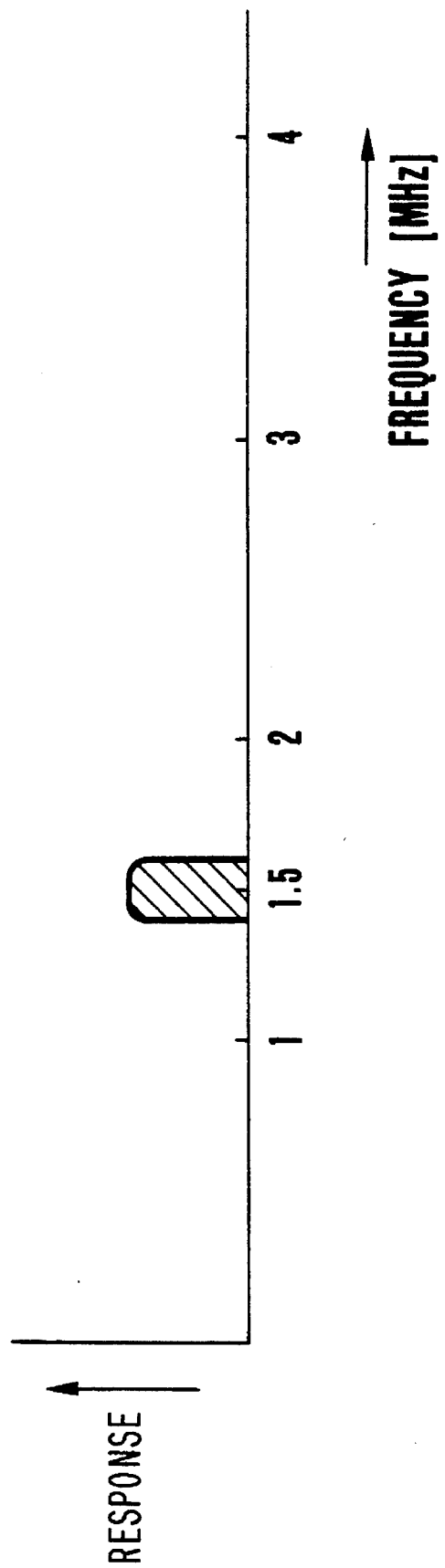
FIG. 7 is a view showing the frequency spectrum of a frequency-modulated audio signal formed by the conventional frequency-modulating apparatus shown in FIG. 6.
Figure 8:
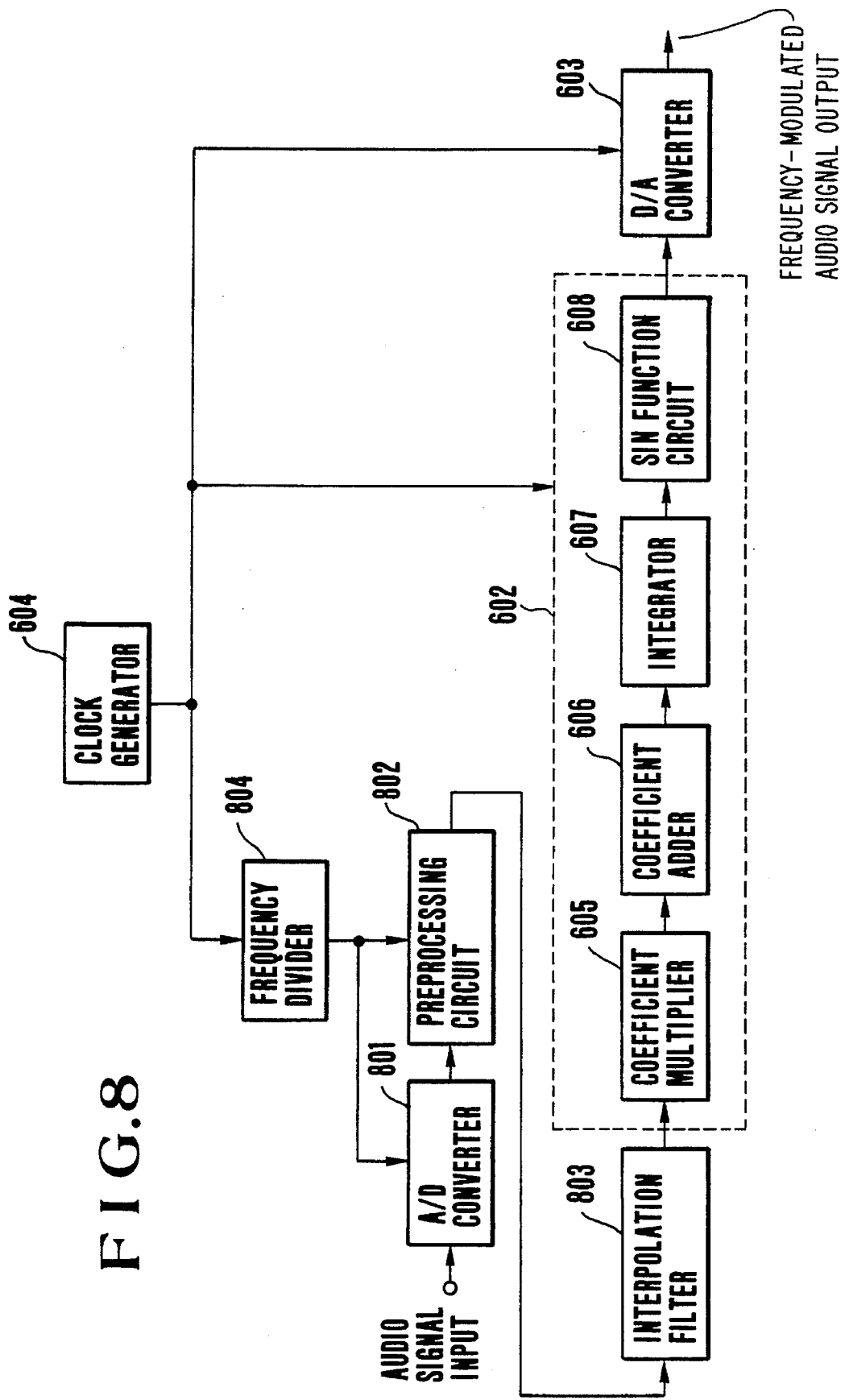
FIG. 8 is a block diagram of a conventional information signal processing apparatus, schematically showing the arrangement of another frequency-modulating apparatus for frequency-modulating an audio signal.

It is to be noted that the frequency spectrum shown in FIG. 21(*c*) can be considered equivalent to the frequency spectrum of a frequency-modulated audio signal of carrier frequency 1.5 MHz (i.e., the frequency-modulated audio signal shown in FIG. 7). Accordingly, the sample pulse signal having the frequency spectrum shown in FIG. 21(*c*), which is outputted from the filter circuit 612, is converted into an analog signal in the D/A converter 603 which operates in accordance with the clock signal of frequency 4 MHz outputted from the clock generator 604, and the resultant analog signal is outputted from the D/A converter 603 as a frequency-modulated audio signal.

Accordingly, in the fourth embodiment, a frequency-modulated audio signal equivalent to the frequency-modulated audio signal obtained from the conventional frequency-modulating apparatus can be obtained by means of a low-cost modulation processing circuit block which operates with a clock signal of frequency (in the fourth embodiment, 2 MHz) lower than that used in the conventional frequency-modulating apparatus.

As described above, the frequency-modulating apparatus according to the fourth embodiment of the present invention is arranged to receive an input frequency-modulated audio signal, form a sample pulse signal by sampling the input frequency-modulated audio signal in accordance with a sampling clock signal of frequency 2 MHz, subject the formed sample pulse signal to frequency-modulation processing, form a re-sample pulse signal by re-sampling the sample pulse signal subjected to the frequency-modulation processing in accordance with a clock signal of frequency 4 MHz, extracts a high-frequency component from the re-sample pulse signal, and output the high-frequency component. According to the above-described arrangement, it is possible to reduce the amount of computational processing per unit time in the frequency-modulation processing, whereby it is possible to perform frequency-modulation processing of an audio signal by means of a low-speed computational processing circuit. Accordingly, it is possible to reduce the complexity and cost of the apparatus.

What is claimed is:

1. An information signal processing apparatus for processing an information signal, comprising:

(A) sampling means for receiving as its input a frequency-modulated information signal having a predetermined frequency band, forming a sample pulse signal by sampling the input frequency-modulated information signal in accordance with a clock signal having a first frequency representative of a sub-Nyquist frequency of the input frequency-modulated information signal, and outputting the sample pulse signal; and (B) sample pulse signal computing processing means for performing computing processing of the sample pulse signal outputted from said sampling means, in accordance with the clock signal having the first frequency.

2. An information signal processing apparatus according to claim 1, wherein the frequency-modulated information signal includes a frequency-modulated audio signal, said sample pulse signal computing processing means being arranged to perform demodulation processing of the frequency-modulated audio signal by processing, in accordance with the clock signal having the first frequency, the sample pulse signal outputted from said sampling means.

3. An information signal processing apparatus according to claim 1, wherein said sample pulse signal computing processing means includes:

(a) phase shifting means for receiving as its input the sample pulse signal outputted from said sampling means, shifting a phase of the input sample pulse signal by $\pi/2$ and outputting the sample pulse signal shifted by $\pi/2$ in phase;

(b) division means for receiving as one input the sample pulse signal outputted from said sampling means and as another input the sample pulse signal outputted from said phase shifting means and shifted by $\pi/2$ in phase with respect to the input sample pulse signal, dividing the input sample pulse signal by the sample pulse signal outputted from said phase shifting means and shifted by $\pi/2$ in phase, and outputting a signal indicative of a division result;

(c) $\tan^{-1}$ processing means for performing $\tan^{-1}$ processing of the signal outputted from said division means and outputting a signal indicative of a result of the $\tan^{-1}$ processing;

(d) differentiating means for differentiating the signal outputted from said $\tan^{-1}$ processing means and outputting a signal indicative of a differentiation result; and (e) correcting means for performing correction processing of the signal outputted from said differential means and outputting a signal indicative of a result of the correction processing.

4. An information signal processing apparatus for processing an information signal, comprising:

(A) sampling means for receiving as its input a frequency-modulated information signal having a predetermined frequency band, and sampling means forming a sample pulse signal by sampling the input frequency-modulated information signal according to a first clock signal having a frequency larger than two times a maximum value of a frequency component of the frequency-modulated information signal, and outputting the sample pulse signal;

(B) clock signal generating means for generating a second clock signal having a second frequency which is positioned in a frequency band higher than the frequency band of the input frequency-modulated information signal; and (C) sample pulse signal computing processing means for performing computing processing of the sample pulse signal outputted from said sampling means, in accordance with the second clock signal generating from said clock signal generating means.

5. An information signal processing apparatus according to claim 4, wherein the frequency-modulated information signal includes a frequency-modulated audio signal, said sample pulse signal computing processing means being arranged to perform demodulation processing of the frequency-modulated audio signal by processing, in accordance with the second clock signal having the first frequency, the sample pulse signal outputted from said sampling means.

6. An information signal processing apparatus according to claim 4, wherein said sample pulse signal computing processing means includes:

(a) phase shifting means for receiving as its input the second sample pulse signal outputted from said second sampling means, shifting a phase of the input second sample pulse signal by $\pi/2$ and outputting the sample pulse signal shifted by $\pi/2$ in phase;

(b) division means for receiving as one input the second sample pulse signal outputted from said second sampling means and as another input the second sample pulse signal outputted from said phase shifting means and shifted by $\pi/2$ in phase with respect to the input second sample pulse signal, dividing the input second sample pulse signal by the second sample pulse signal outputted from said phase shifting means and shifted by $\pi/2$ in phase, and outputting a signal indicative of a division result;

(c) $\tan^{-1}$ processing means for performing $\tan^{-1}$ processing of the signal outputted from said division means and outputting a signal indicative of a result of the $\tan^{-1}$ processing;

(d) differentiating means for differentiating the signal outputted from said $\tan^{-1}$ processing means and outputting a signal indicative of a differentiation result; and (e) correcting means for performing correction processing of the signal outputted from said differential means and outputting a signal indicative of the correction processing.

7. An information signal processing apparatus for processing an information signal, comprising:

(A) first sampling means for receiving as its input an information signal, forming a sample signal by sampling the input information signal in accordance with a clock signal having a first frequency, and outputting the sample signal;

(B) signal processing means for performing signal processing of the sample signal outputted from said first sampling means and outputting a sample signal indicative of a result of the signal processing;

(C) second sampling means for forming a re-sample signal by re-sampling the sample signal outputted from said signal processing means, in accordance with a clock signal having a second frequency which is n times the first frequency (n is a positive integer of $n \geq 2$), and outputting the re-sample signal; and (D) filter means for extracting and outputting a high-frequency component of the re-sample signal outputted from said second sampling means.

8. An information signal processing apparatus according to claim 7, wherein the information signal includes an audio signal, said signal processing means being arranged to perform frequency-modulation processing for forming a frequency-modulated audio signal by performing computing processing of the sample signal outputted from said first sampling means.

9. An information signal processing apparatus according to claim 7, wherein said signal processing means includes:

(a) coefficient multiplying means for receiving as its input the sample signal outputted from said first sampling means, multiplying the input sample signal by a predetermined coefficient, and outputting a sample signal indicative of a multiplication result;

(b) coefficient adding means for adding a predetermined coefficient to the sample signal outputted from said coefficient multiplying means and outputting a sample signal indicative of an addition result;

(c) integrating means for integrating the sample signal outputted from said coefficient adding means and outputting a sample signal indicative of an integration result; and (d) sin function processing means for performing sin function processing of the sample signal outputted from said integrating means and outputting a signal indicative of a result of the sin function processing.

10. An information signal processing apparatus for processing an information signal, comprising:

(A) analog/digital conversion means for receiving as its input an information signal having a predetermined frequency band, converting the input analog information signal into a digital information signal in accordance with a first clock signal having a first frequency, and outputting the digital information signal;

(B) digital information signal computing processing means for performing computing processing of the digital information signal outputted from said analog/digital conversion means in accordance with the first clock signal and outputting a digital information signal indicative of a result of the computing processing;

(C) digital data signal generating means for generating a digital data signal whose signal level is zero;

(D) switching output means for receiving as one input the digital information signal outputted from said digital information signal computing processing means and as another input the digital data signal generated by said digital data signal generating means, and outputting the digital information signal and the digital data signal in an alternately switching manner in accordance with a second clock signal having a frequency of n times the first frequency (n is a positive integer of $n \geq 2$);

(E) filter processing means for subjecting the digital signal outputted from said switching output means to filter processing based on the second clock signal and outputting a digital signal indicative of a result of the filter processing; and (F) digital/analog conversion means for receiving as its input the digital signal outputted from said filter processing means, converting the input digital signal into an analog signal in accordance with the second clock signal, and outputting the analog signal.

11. An information signal processing apparatus according to claim 10, wherein the information signal includes an audio signal, said digital information signal computing processing means being arranged to perform frequency modulation processing for forming the frequency-modulated audio signal by performing computing processing of a digital audio signal outputted from said analog/digital conversion means, in accordance with the first clock signal.

12. An information signal processing apparatus according to claim 10, wherein said digital information signal computing processing means includes:

(a) coefficient multiplying means for receiving as its input the digital information signal outputted from said analog/digital conversion means, multiplying the input digital information signal by a predetermined coefficient, and outputting a digital information signal indicative of a multiplication result;

(b) coefficient adding means for adding a predetermined coefficient to the digital information signal outputted from said coefficient multiplying means and outputting a digital information signal indicative of an addition result;

(c) integrating means for integrating the digital information signal outputted from said coefficient adding means and outputting a digital information signal indicative of an integration result; and (d) sin function processing means for performing sin function processing of the digital information signal outputted from said integrating means and outputting a signal indicative of a result of the sin function processing.

13. An information signal processing apparatus for processing an information signal, comprising:

(A) phase shifting means for receiving as its input a frequency-modulated information signal, shifting a phase of the input frequency-modulated information signal by $\pi/2$ and outputting the frequency-modulated information signal shifted by $\pi/2$ in phase;

(B) division means for receiving as one input the frequency-modulated information signal and as another input the frequency-modulated information signal outputted from said phase shifting means and shifted by $\pi/2$ in phase with respect to the input frequency-modulated information signal, dividing the input frequency-modulated information signal by the frequency-modulated information signal outputted from said phase shifting means and shifted by $\pi/2$ in phase, and outputting a signal indicative of a division result; and (C) dropout detecting means for checking a state of the signal outputted from said division means and detecting on the basis of a check result whether a dropout has occurred in the input frequency-modulated information signal.

14. An information signal processing apparatus according to claim 13, further comprising:

(a) $\tan^{-1}$ processing means for performing $\tan^{-1}$ processing of the signal outputted from said division means and outputting a signal indicative of a result of the $\tan^{-1}$ processing;

(d) differentiating means for differentiating the signal outputted from said $\tan^{-1}$ processing means and outputting a signal indicative of a differentiation result; and (c) correcting means for performing correction processing of a D.C. component of the signal outputted from said differential means and outputting a signal indicative of the correction processing.

15. An information signal processing apparatus according to claim 13, wherein said division means is arranged to output an overflow pulse if said division means fails to calculate a division result which lies within a predetermined level range.

16. An information signal processing apparatus according to claim 15, wherein said dropout detecting means is arranged to detect an interval during which the overflow pulse is outputted from said division means, and, if the detected interval during which the overflow pulse is outputted exceeds a predetermined interval, determine that a dropout has occurred in the input frequency-modulated information signal, to output a dropout detection signal.

17. An information signal processing apparatus for processing an information signal, comprising:

(A) sampling means for receiving as its input a frequency-modulated information signal having a predetermined frequency band, said sampling means forming a sample pulse signal by sampling the input frequency-modulated information signal according to a clock signal having a first frequency smaller than two times of a maximum value of a frequency component of the frequency-modulated information signal, but larger than said maximum value of a frequency component of the frequency-modulated information signal, and outputting the sample pulse signal; and (B) sample pulse signal computing processing means for performing computing processing of the sample pulse signal outputted from said sampling means, in accordance with the clock signal having the first frequency.

18. An information signal processing apparatus according to claim 17, wherein the frequency-modulated information signal includes a frequency-modulated audio signal, said sample pulse signal computing processing means being arranged to perform demodulation processing of the frequency-modulated audio signal by processing, in accordance with the clock signal having the first frequency, the sample pulse signal outputted from said sampling means.

19. An information signal processing apparatus according to claim 17, wherein said sample pulse signal computing processing means includes:

(A) phase shifting means for receiving as its input the sample pulse signal outputted from said sampling means, shifting a phase of the input sample pulse signal by $\pi/2$ and outputting the sample pulse signal shifted by $\pi/2$ in phase;

(B) division means for receiving as one input the sample pulse signal outputted from said sampling means and as another shifting means and shifted by $\pi/2$ in phase with respect to the input sample pulse signal, dividing the input sample pulse signal by the sample pulse signal outputted from said phase shifting means and shifted by $\pi/2$ in phase, and outputting a signal indicative of a division result;

(C) $\tan^{-1}$ processing means for performing $\tan^{-1}$ processing of the signal outputted from said division means and outputting a signal indicative of a result of the $\tan^{-1}$ processing;

(D) differentiating means for differentiating the signal outputted from said $\tan^{-1}$ processing means and outputting a signal indicative of a differentiation result; and (E) correcting means for performing correction processing of the signal outputted from said differential means and outputting a signal indicative of a result of the correction processing.

* * * * *